(12) United States Patent
Toyoda et al.

(10) Patent No.: US 9,543,217 B2
(45) Date of Patent: Jan. 10, 2017

(54) SEMICONDUCTOR DEVICE AND METHOD OF MANUFACTURING SEMICONDUCTOR DEVICE

(71) Applicant: FUJI ELECTRIC CO., LTD., Kawasaki-shi, Kanagawa (JP)

(72) Inventors: Yoshiaki Toyoda, Matsumoto (JP); Hideaki Katakura, Matsumoto (JP); Takatoshi Ooe, Matsumoto (JP)

(73) Assignee: FUJI ELECTRIC CO., LTD., Kawasaki-shi, Kanagawa (JP)

( * ) Notice: Subject to any disclaimer, the term of this patent is extended or adjusted under 35 U.S.C. 154(b) by 0 days.

(21) Appl. No.: 15/150,516

(22) Filed: May 10, 2016

(65) Prior Publication Data

US 2016/0254198 A1 Sep. 1, 2016

Related U.S. Application Data

(63) Continuation of application No. PCT/JP2015/061638, filed on Apr. 15, 2015.

(30) Foreign Application Priority Data

May 14, 2014 (JP) ................................. 2014-100389

(51) Int. Cl.
*H01L 21/8238* (2006.01)
*H01L 21/265* (2006.01)

(52) U.S. Cl.
CPC ..... *H01L 21/823885* (2013.01); *H01L 21/265* (2013.01); *H01L 21/26546* (2013.01);
(Continued)

(58) Field of Classification Search
CPC ............... H01L 21/26553; H01L 21/70; H01L 21/8232; H01L 29/66007
See application file for complete search history.

(56) References Cited

U.S. PATENT DOCUMENTS

| 6,323,518 B1 | 11/2001 | Sakamoto et al. |
| 2001/0030345 A1 | 10/2001 | Shiiki et al. |

(Continued)

FOREIGN PATENT DOCUMENTS

| JP | H08-130309 A | 5/1996 |
| JP | H11-354627 A | 12/1999 |

(Continued)

OTHER PUBLICATIONS

International Search Report dated Jul. 1, 2015.

*Primary Examiner* — Cheung Lee
(74) *Attorney, Agent, or Firm* — Rabin & Berdo, P.C.

(57) ABSTRACT

One embodiment includes a vertical n-channel power MOSFET for an output stage and a horizontal p-channel MOSFET for controlling the vertical n-channel power MOSFET are disposed on a single semiconductor substrate. The horizontal p-channel MOSFET has Psd (a $p^+$-type source region and a $p^+$-type drain region) formed in a self-aligning manner at a gate electrode. The Psd has $p^+$-type diffusion regions disposed therein causing the Psd to partially have a high impurity concentration. The $p^+$-type diffusion regions are connected to respective metal wiring layers through contact holes that are formed by ion implantation concurrently with a $p^+$-type diffusion region of the vertical n-channel power MOSFET and that have a width narrower than conventional contact holes. In this way, contact properties can be improved between the metal wiring layer and a semiconductor portion and size reductions can be achieved.

5 Claims, 20 Drawing Sheets

(52) U.S. Cl.
CPC ........ *H01L 21/823807* (2013.01); *H01L 21/823871* (2013.01)

(56) References Cited

U.S. PATENT DOCUMENTS

| | | |
|---|---|---|
| 2002/0158277 A1 | 10/2002 | Harada et al. |
| 2004/0063291 A1 | 4/2004 | Williams et al. |
| 2007/0052016 A1 | 3/2007 | Otake et al. |
| 2009/0085109 A1 | 4/2009 | Izumi |

FOREIGN PATENT DOCUMENTS

| | | |
|---|---|---|
| JP | 2000-091344 A | 3/2000 |
| JP | 2002-057333 A | 2/2002 |
| JP | 2002-359294 A | 12/2002 |
| JP | 2006-514425 A | 4/2006 |
| JP | 2007-067127 A | 3/2007 |
| JP | 2009-099955 A | 5/2009 |
| JP | 2012-238741 A | 12/2012 |

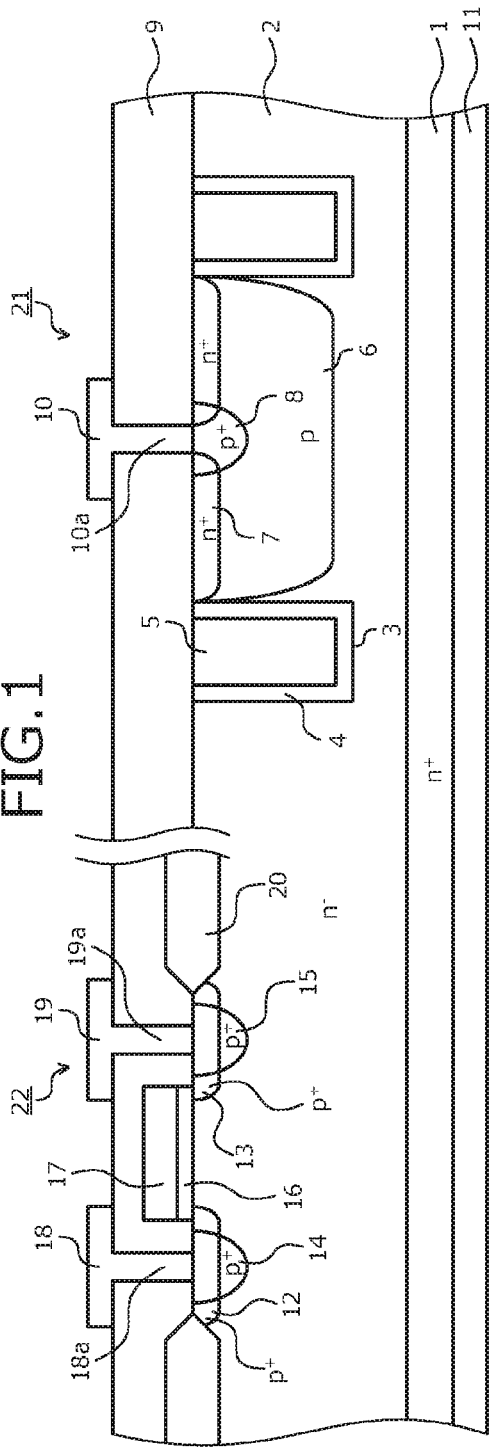
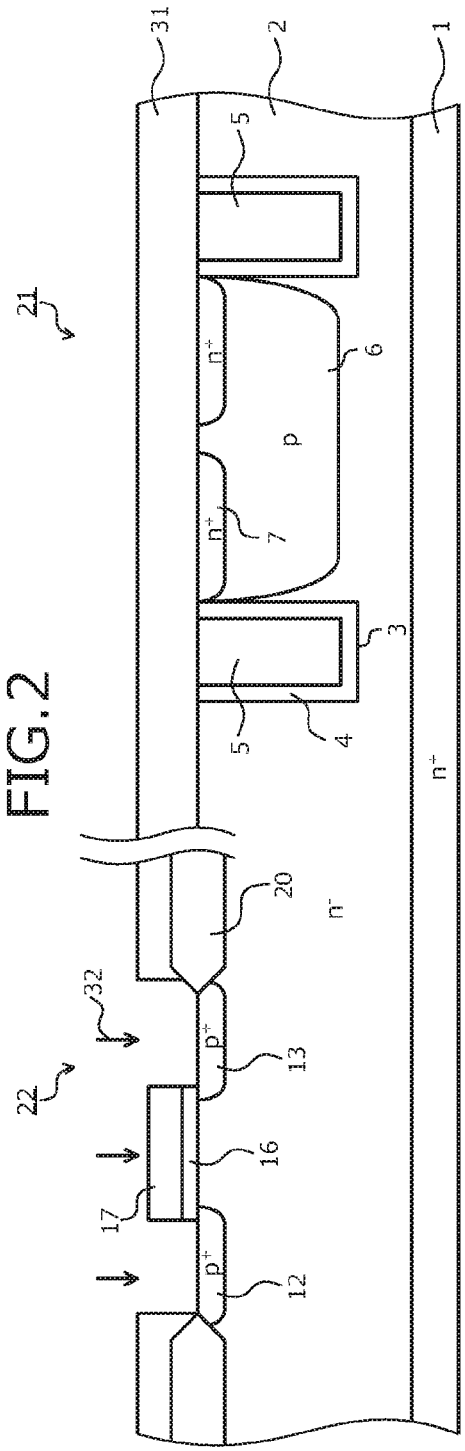

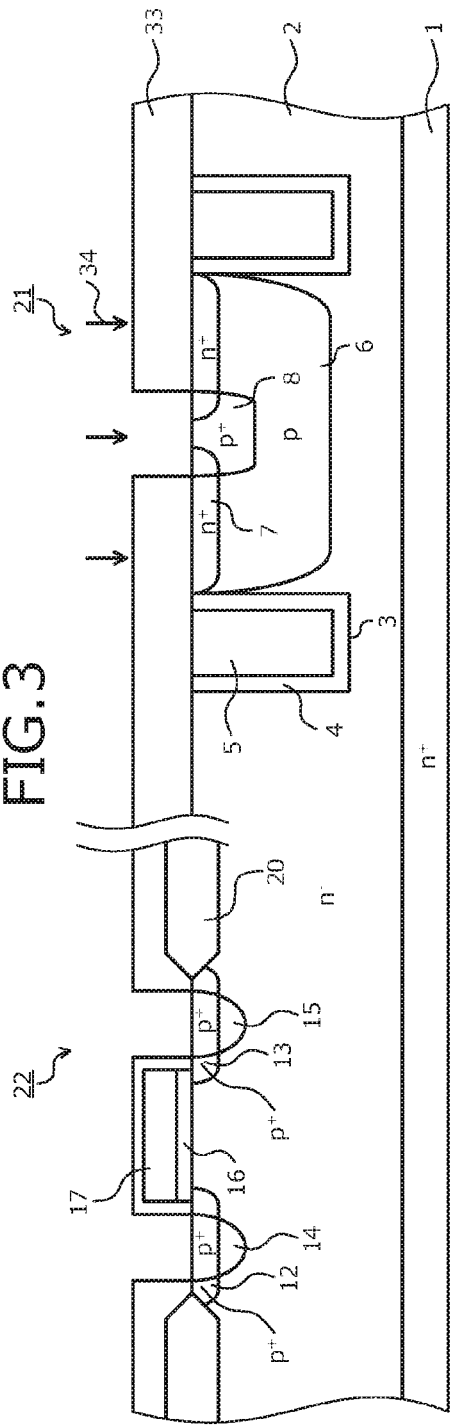
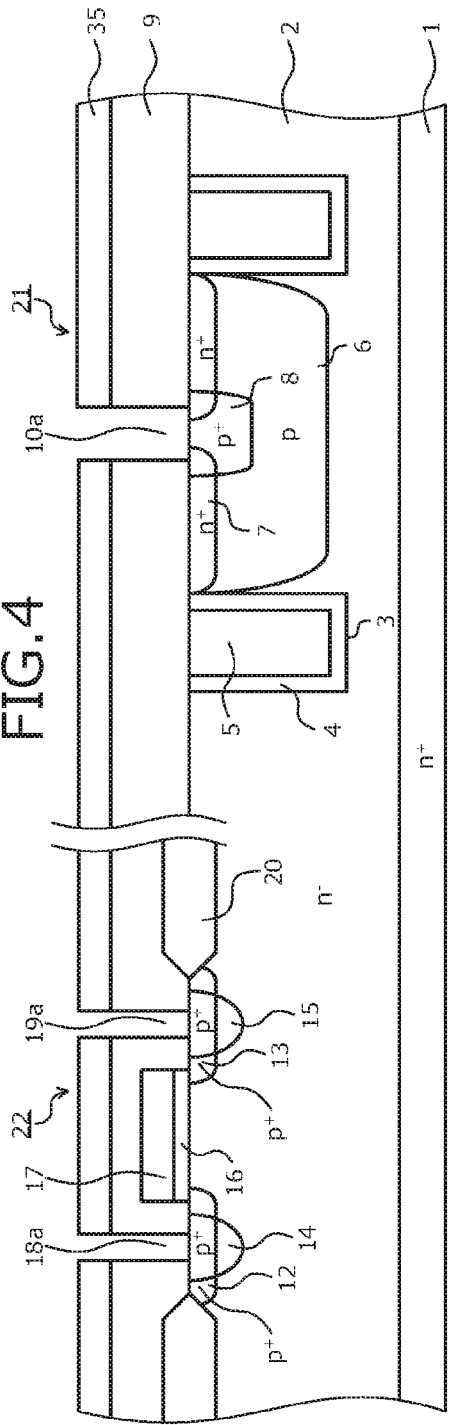

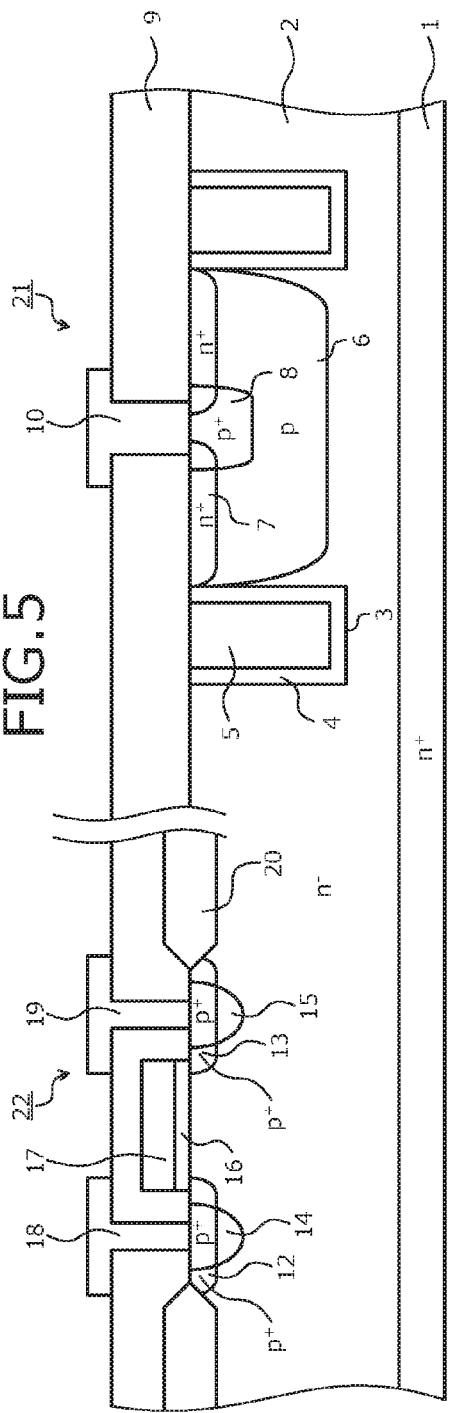
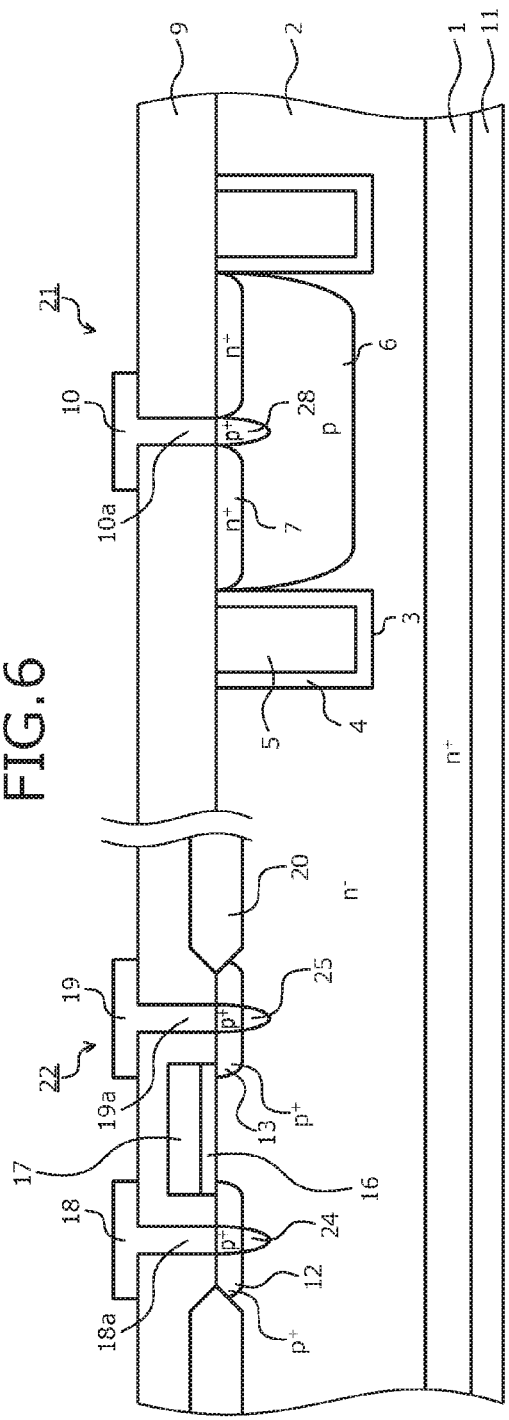

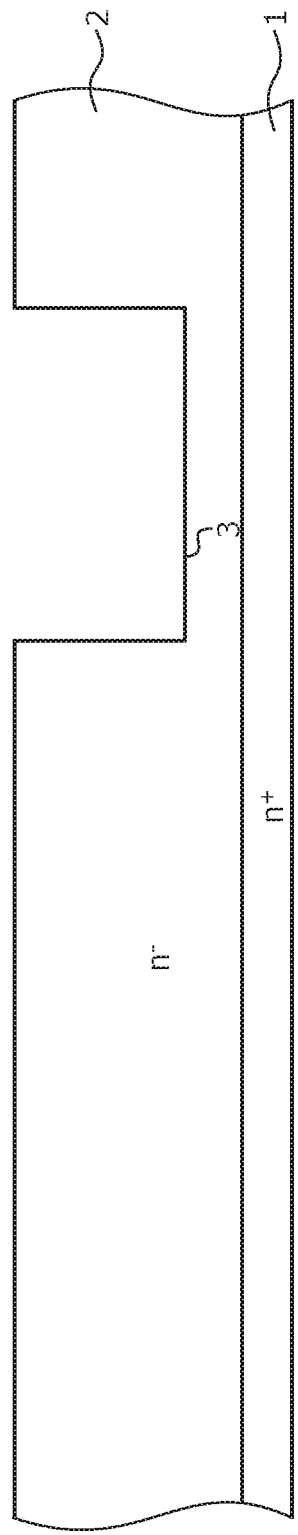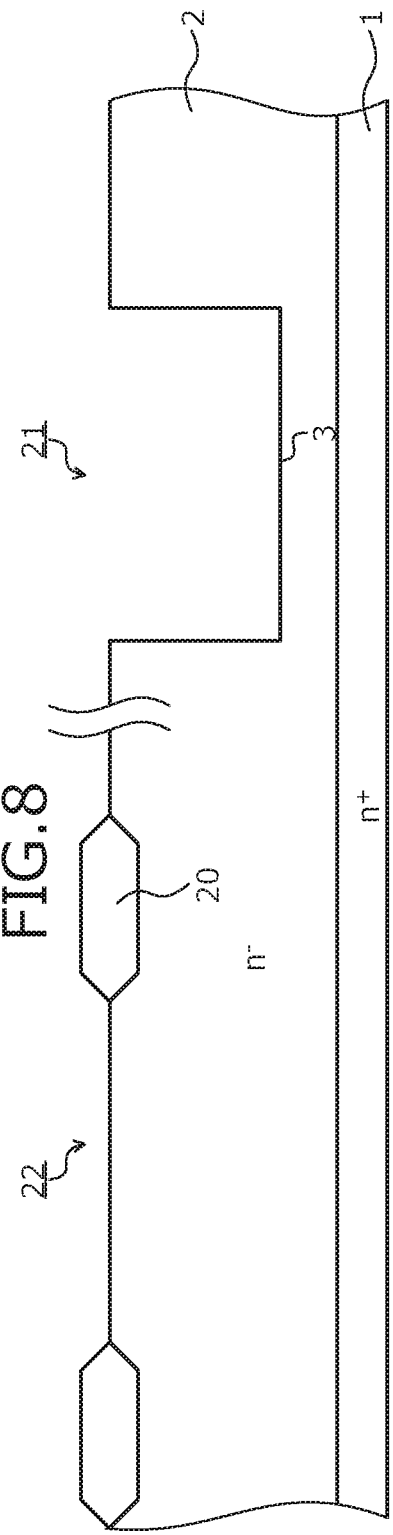

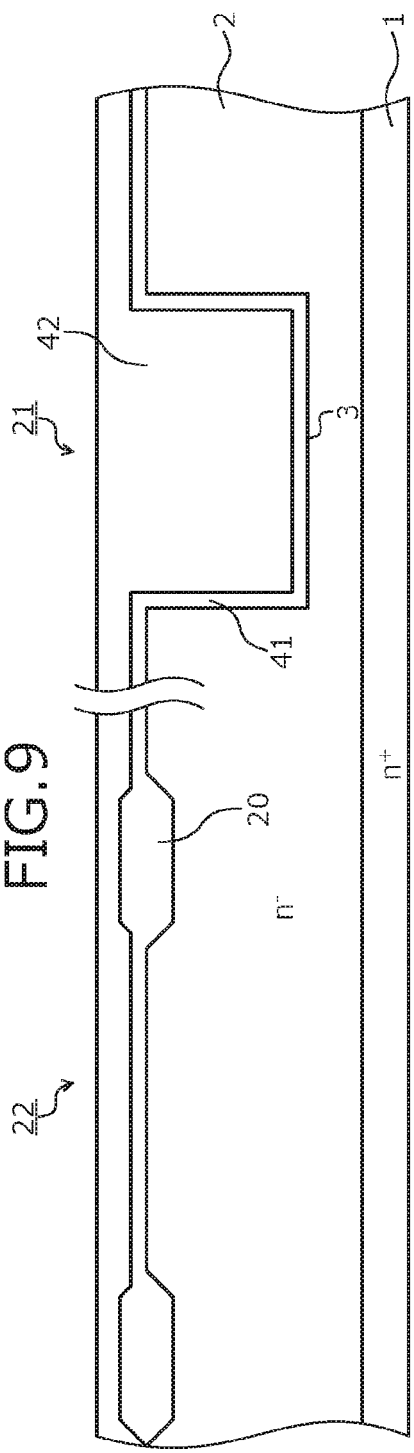
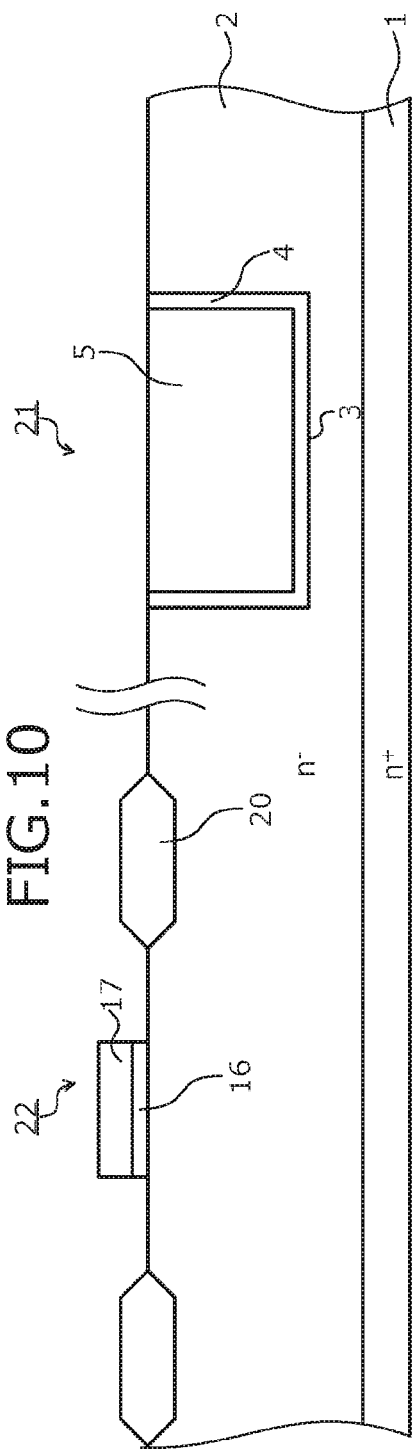

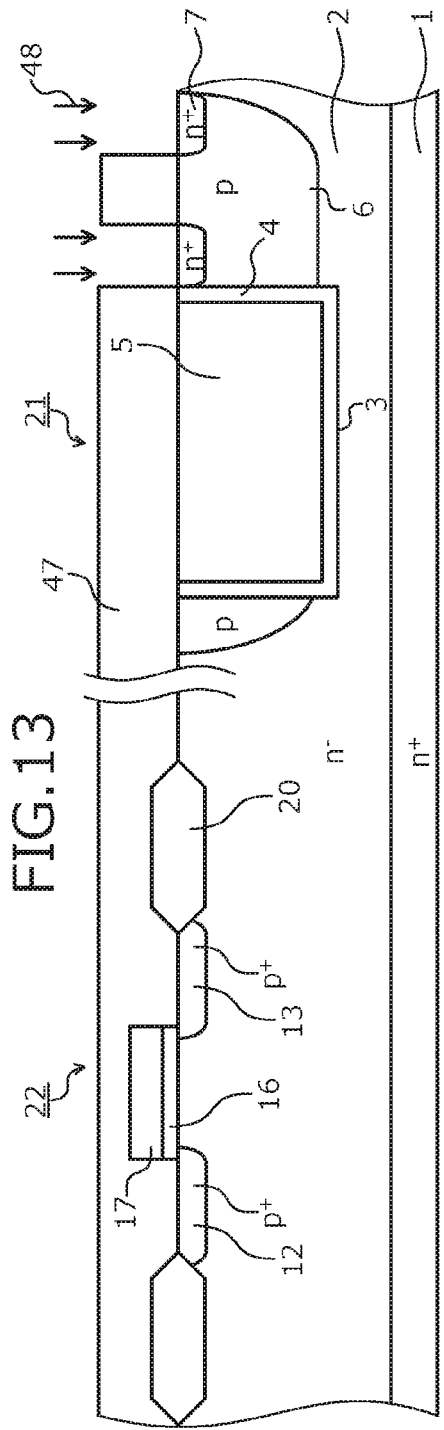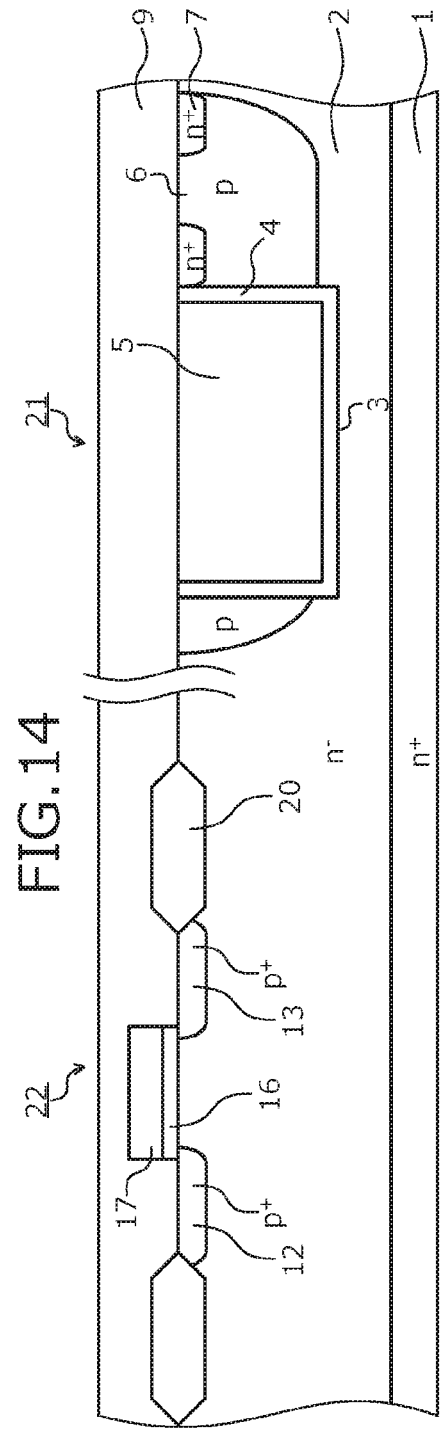

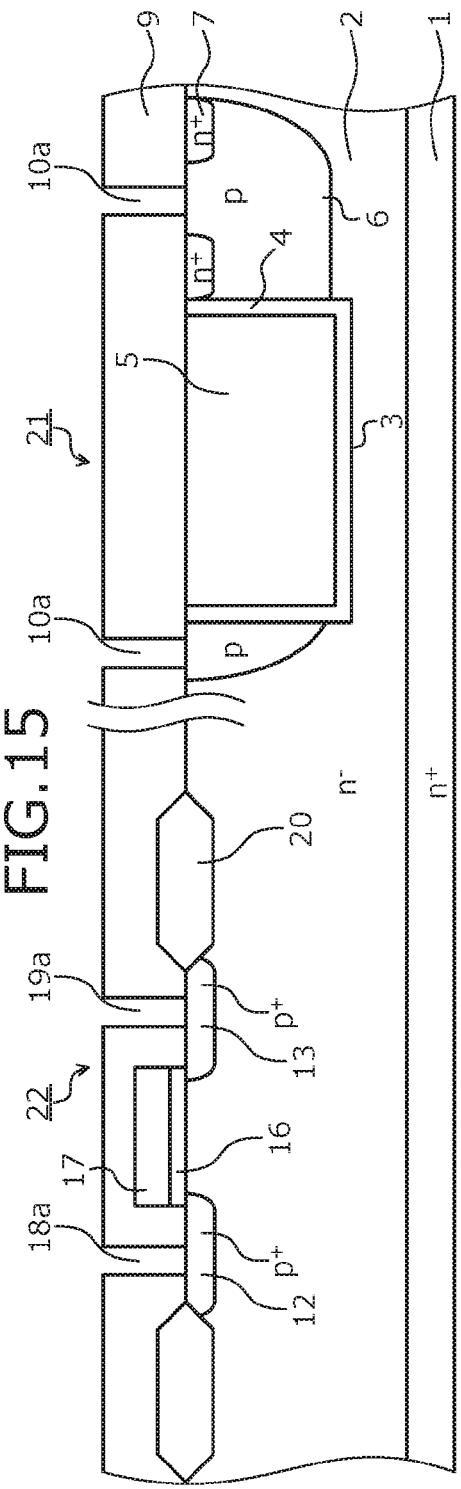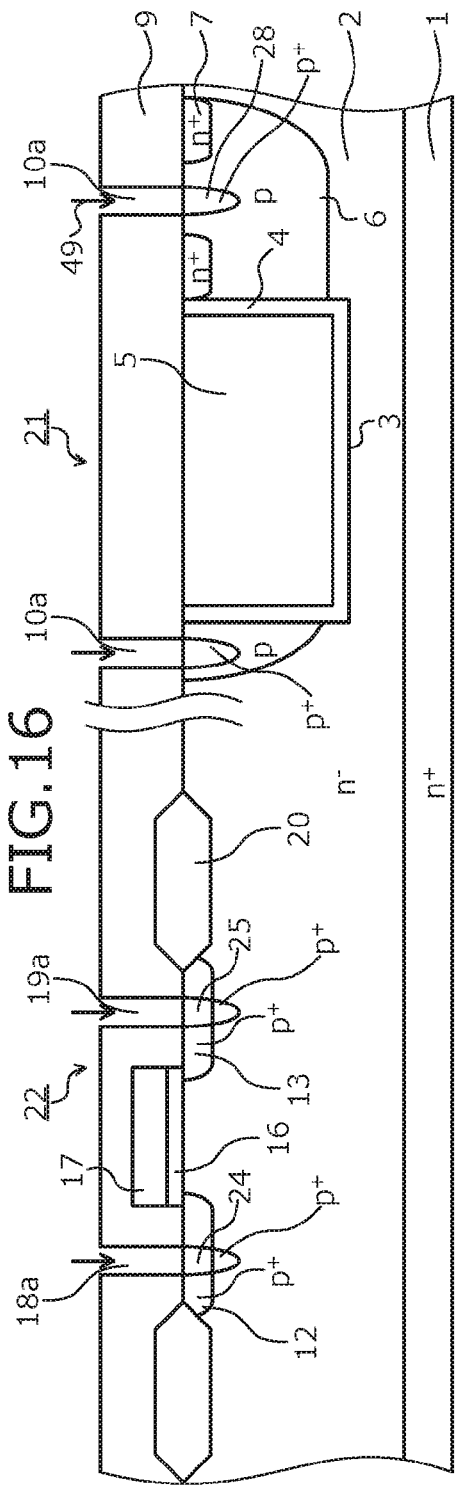

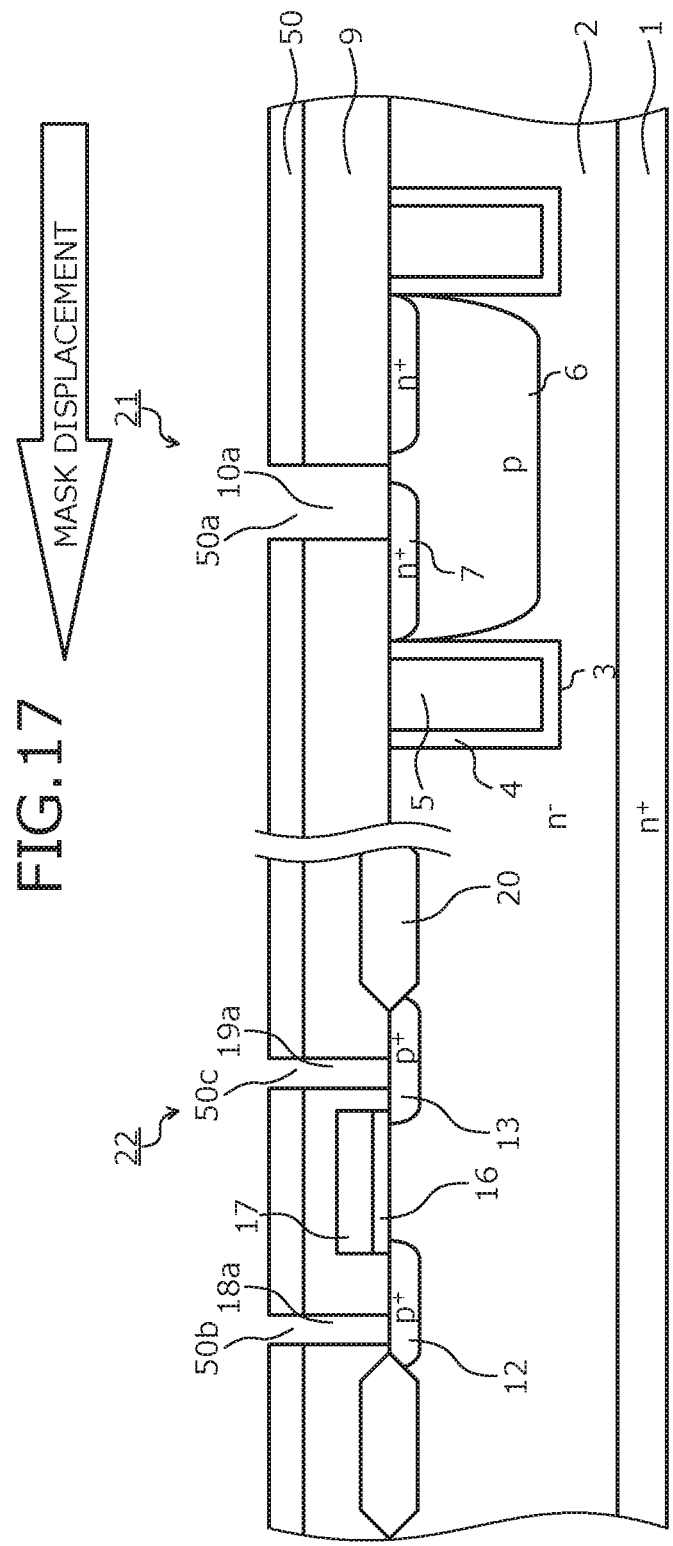

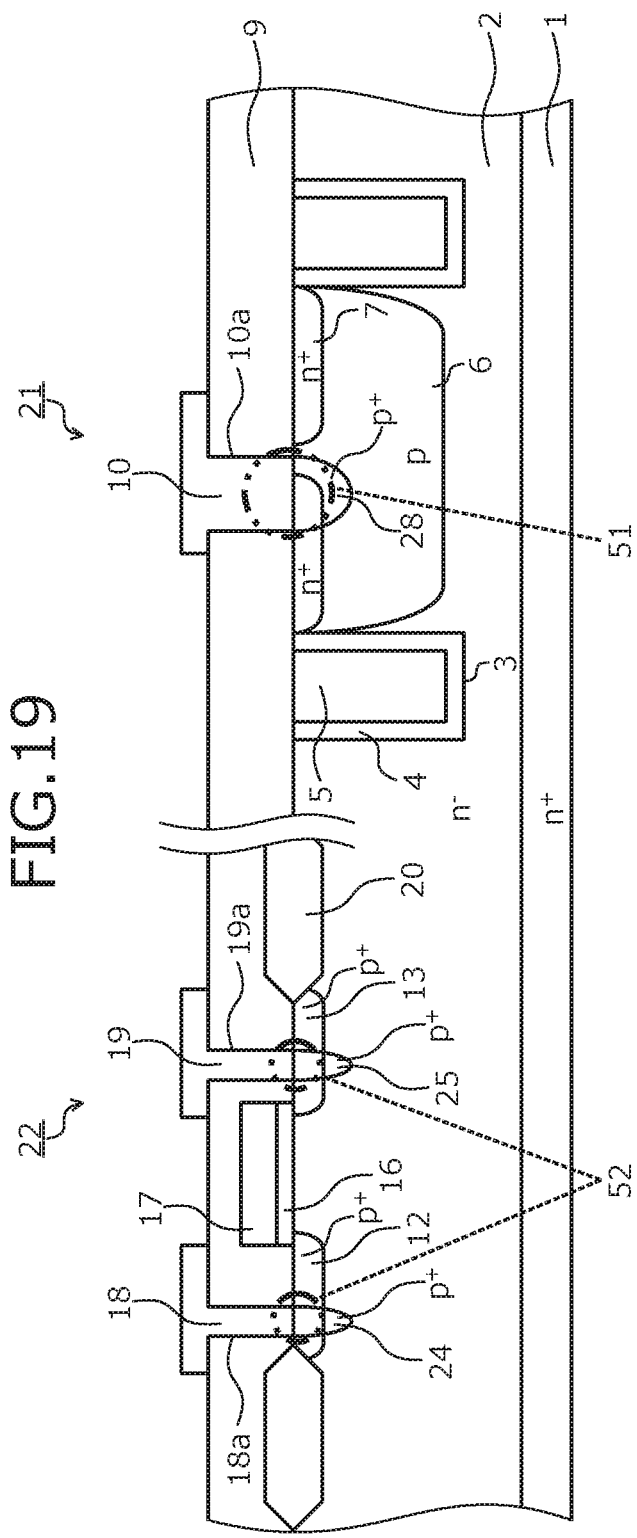

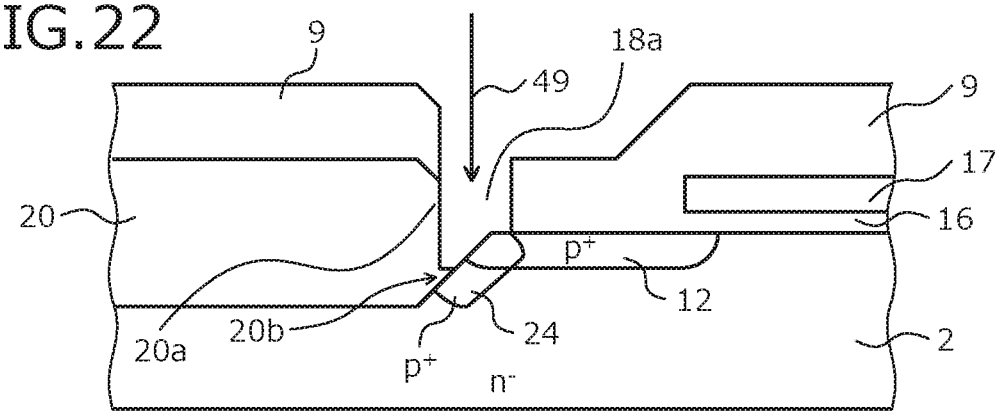
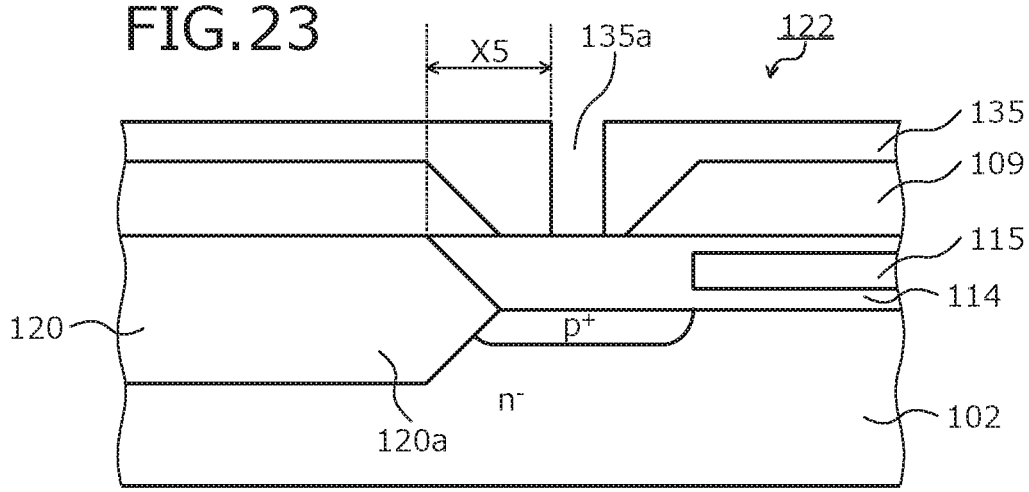
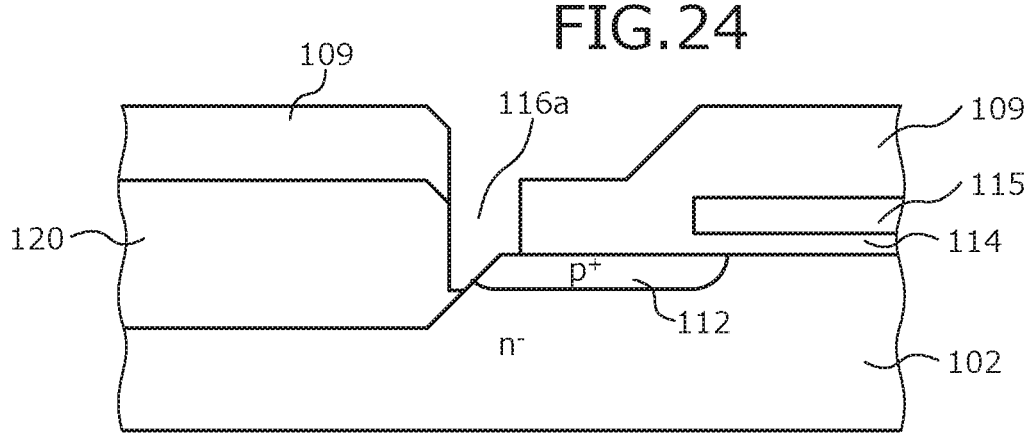

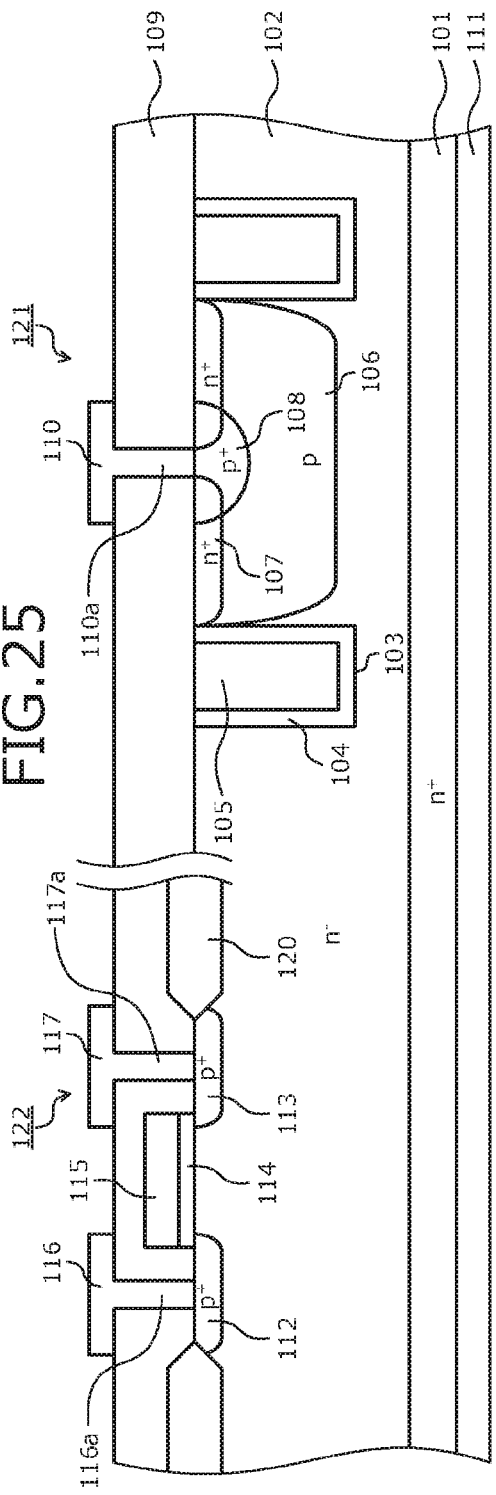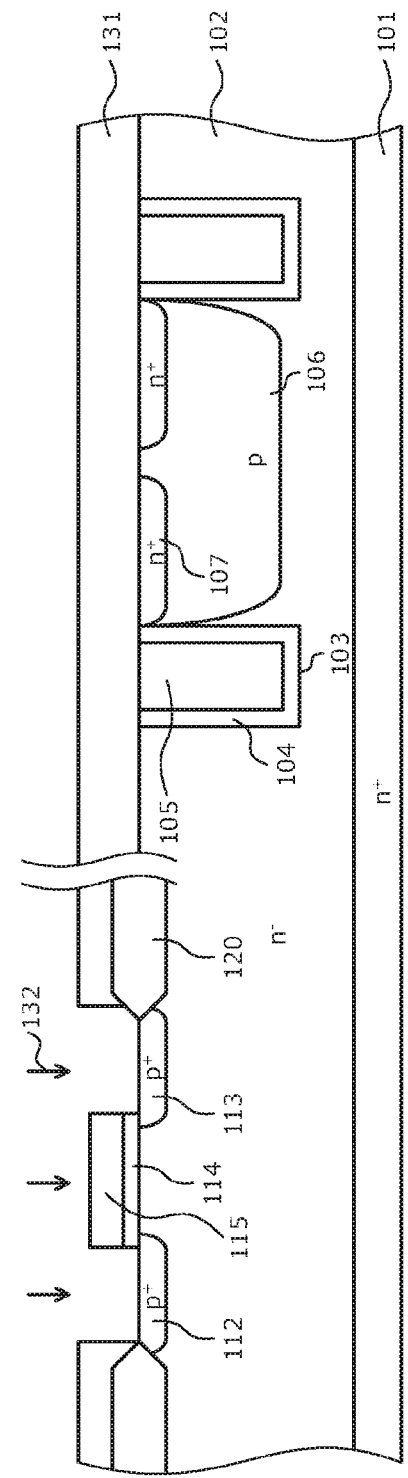

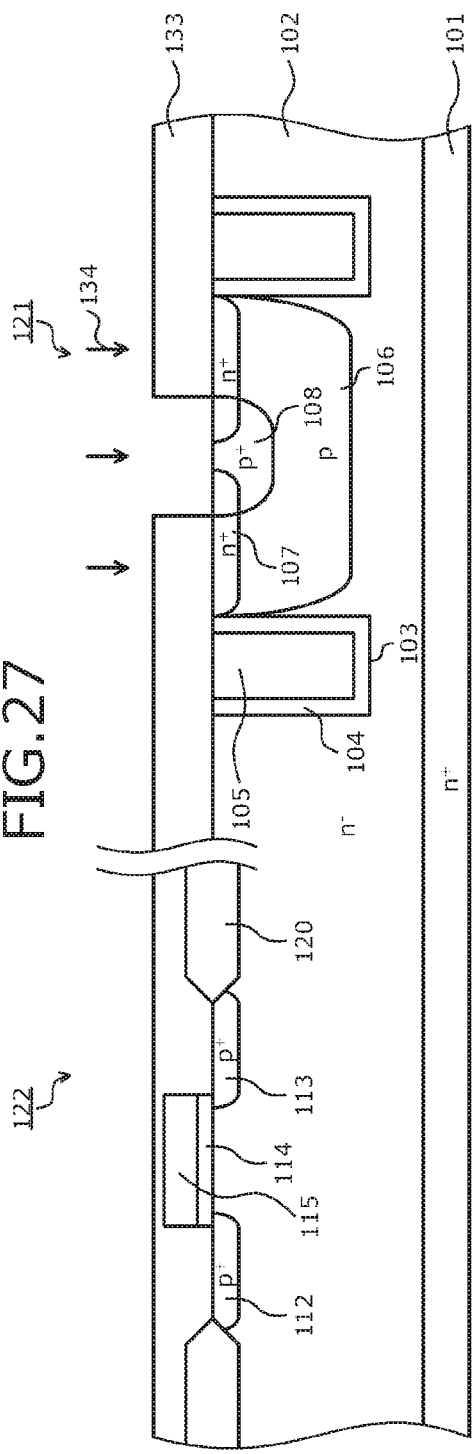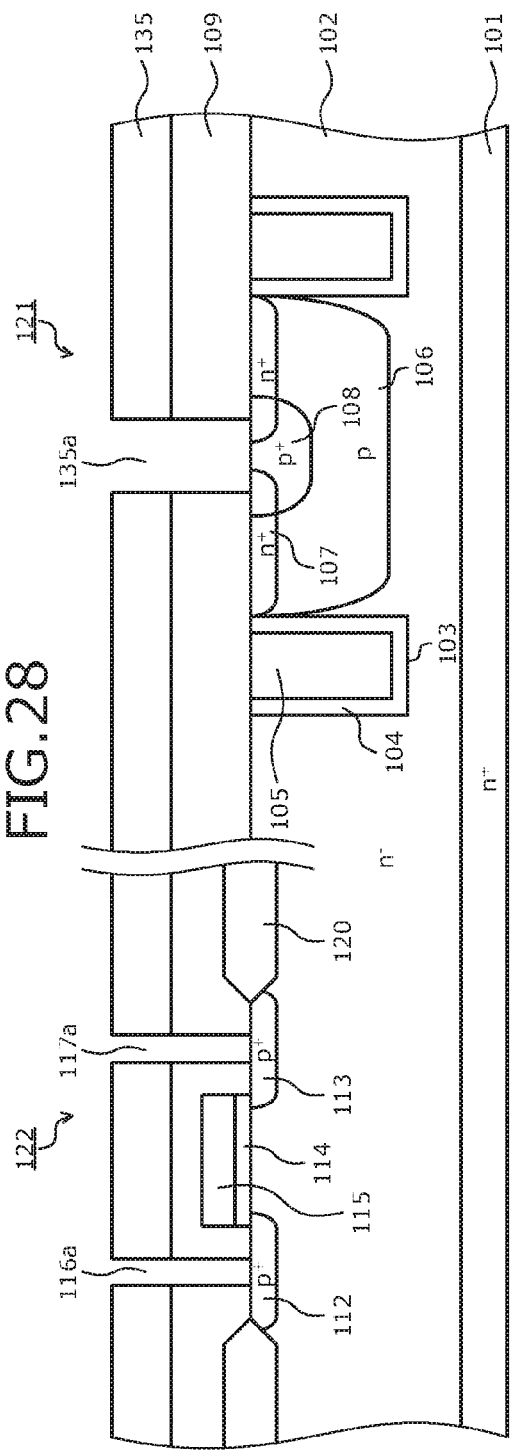

SEMICONDUCTOR DEVICE AND METHOD OF MANUFACTURING SEMICONDUCTOR DEVICE

CROSS REFERENCE TO RELATED APPLICATIONS

This is a continuation application of International Application PCT/JP2015/061638 filed on Apr. 15, 2015 which claims priority from a Japanese Patent Application No. 2014-100389 filed on May 14, 2014, the contents of which are incorporated herein by reference.

BACKGROUND OF THE INVENTION

1. Field of the Invention

The embodiments discussed herein are related to a semiconductor device and method of manufacturing a semiconductor device.

2. Description of the Related Art

A power semiconductor device is conventionally known in which a vertical power semiconductor device and a horizontal semiconductor device configuring a control/protection circuit (circuit unit) of the vertical power semiconductor device are disposed on a single semiconductor substrate (semiconductor chip) to increase reliability and reduce size and cost (see, e.g., Japanese Laid-Open Patent Publication Nos. 2002-359294 and 2000-091344). The structure of a conventional semiconductor device will be described taking as an example, a power semiconductor device in which a vertical n-channel power metal-oxide-semiconductor field-effect transistor (MOSFET) for an output stage and a horizontal complementary MOS (CMOS) for a control circuit are disposed on a single semiconductor substrate.

FIG. 25 is a cross-sectional view of a structure of a conventional semiconductor device. The semiconductor device depicted in FIG. 25 is an example of a power semiconductor device in which a vertical MOSFET of trench gate structure is disposed as a vertical n-channel power MOSFET 121 for an output stage. FIG. 25 depicts only a horizontal p-channel MOSFET 122 among the horizontal p-channel MOSFET 122 and a horizontal n-channel MOSFET complementarily connected to configure a horizontal complementary CMOS for a control circuit (similarly in FIGS. 26, 27, 28, and 29). In the vertical n-channel power MOSFET 121, an n$^-$-type semiconductor layer 102 acts as a drift region. In the n$^-$-type semiconductor layer 102, a p-type base region 106 is selectively disposed. In the p-type base region 106, both an n$^+$-type source region 107 and a p$^+$-type diffusion region 108 are selectively disposed.

The p$^+$-type diffusion region 108 is connected to a source electrode 110 through a contact hole 110a that penetrates an interlayer dielectric 109 in a depth direction and reaches the p$^+$-type diffusion region 108, and acts as a contact region electrically connecting the n$^+$-type source region 107 and the source electrode 110. On the other hand, in the horizontal p-channel MOSFET 122 configuring a horizontal CMOS, the n$^-$-type semiconductor layer 102 acts as a base region. In the n$^-$-type semiconductor layer 102, both a p$^+$-type source region 112 and a p$^+$-type drain region 113 are selectively disposed. The p$^+$-type source region 112 and the p$^+$-type drain region 113 are p$^+$-type diffusion regions (source/drain regions (Psd)) that have a relatively high impurity concentration and are formed at respective end portions of the gate electrode 115 in a self-aligning manner by ion implantation using, as a mask, a gate electrode 115 disposed on the n$^-$-type semiconductor layer 102 via a gate insulating film 114.

The p$^+$-type source region 112 is connected to a source electrode 116, which is a metal wiring layer, through a contact hole 116a that penetrates the interlayer dielectric 109 in the depth direction and reaches the p$^+$-type source region 112 to thereby form a source terminal of the horizontal p-channel MOSFET 122. The p$^+$-type drain region 113 is connected to a drain electrode 117, which is a metal wiring layer, through a contact hole 117a that penetrates the interlayer dielectric 109 in the depth direction and reaches the p$^+$-type drain region 113 to thereby form a drain terminal of the horizontal p-channel MOSFET 122. Reference numerals 101, 103 to 105, and 111 denote an n$^+$-type semiconductor layer (drain region), a trench, a gate insulating film, a gate electrode, and a drain electrode, respectively, of the vertical n-channel power MOSFET 121. Reference numeral 120 denotes a local oxidation of silicon (LOCOS) film.

A method of manufacturing the conventional semiconductor device depicted in FIG. 25 will be described. FIGS. 26, 27, 28, and 29 are cross-sectional views of states during manufacturing of the conventional semiconductor device. First, as depicted in FIG. 26, on the front surface side (on the n$^-$-type semiconductor layer 102 side) of a semiconductor wafer formed by stacking the n$^+$-type semiconductor layer 101 and the n$^-$-type semiconductor layer 102, a MOS gate (an insulating gate made of metal oxide film semiconductor) structure that is made up of the p-type base region 106, the n$^+$-type source region 107, the trench 103, the gate insulating film 104, and the gate electrode 105 is formed in a formation region of the vertical n-channel power MOSFET 121. Subsequently, on the front surface of the semiconductor wafer, the gate electrode 115 is formed in a formation region of the horizontal p-channel MOSFET 122, via the gate insulating film 114.

On the front surface of the semiconductor wafer, a resist mask 131 is formed that is open from a portion corresponding to the formation region of the p$^+$-type source region 112 to a portion corresponding to the formation region of the p$^+$-type drain region 113 of the horizontal p-channel MOSFET 122. The resist mask 131 and the gate electrode 115 are used as a mask and ion implantation 132 of a p-type impurity is performed to form the p$^+$-type diffusion regions (Psd) that become the p$^+$-type source region 112 and the p$^+$-type drain region 113 in a self-aligning manner at respective end portions of the gate electrode 115. After the resist mask 131 is removed, the p$^+$-type diffusion regions that become the p$^+$-type source region 112 and the p$^+$-type drain region 113 are diffused by heat treatment.

Subsequently, as depicted in FIG. 27, a resist mask 133 is formed that has an open portion corresponding to the formation region of the p$^+$-type diffusion region 108 of the vertical n-channel power MOSFET 121. By using the resist mask 133 as a mask, ion implantation 134 of a p-type impurity is performed to form the p$^+$-type diffusion region 108 inside the p-type base region 106. After the resist mask 133 is removed, the p$^+$-type diffusion region 108 is diffused by heat treatment. Subsequently, as depicted in FIG. 28, the interlayer dielectric 109 is formed on the front surface of the semiconductor wafer. On the interlayer dielectric 109, a resist mask 135 is formed that has open portions corresponding to formation regions of the contact holes 110a, 116a, and 117a. Reference numeral 135a denotes an open portion of the resist mask 135.

The resist mask 135 is used as a mask and the interlayer dielectric 109 is etched to form the contact holes 110a, 116a, 117a. Subsequently, as depicted in FIG. 29, after the resist mask 135 is removed, a metal wiring layer made of aluminum (Al) is formed to be embedded in the contact holes 110a, 116a, 117a. This metal wiring layer is patterned to leave a portion as the source electrode 110 of the vertical n-channel power MOSFET 121 and portions as the source electrode 116 and the drain electrode 117 of the horizontal p-channel MOSFET 122. On the entire back surface of the semiconductor wafer (the surface on the n$^+$-type drain region side), a back surface electrode 111 is formed as a drain electrode of the vertical n-channel power MOSFET 121. Subsequently, the semiconductor wafer is diced (cut) into individual chip shapes to complete the conventional semiconductor device depicted in FIG. 25.

As a method of manufacturing a single unit of a vertical MOSFET, a method has been proposed that includes performing ion implantation using, as a mask, a contact hole of a MOS transistor to form a high-concentration diffusion region (see, e.g., Japanese Laid-Open Patent Publication No. 2002-057333). As another method of manufacturing a single unit of a vertical MOSFET, the following method has been proposed. In an n$^-$-type epitaxial layer, a p$^+$-type diffusion layer is provided as a back gate region and an n$^+$-type diffusion layer is provided as a drain region. In the p$^+$-type diffusion layer (the back gate region), an n$^{++}$-diffusion layer is provided as a source region along with a p$^{++}$-diffusion layer. The p$^{++}$-diffusion layer is formed by two ion implantation steps according to a shape of a contact hole and has an impurity concentration that is adjusted in a surface portion and a deep portion thereof (see, e.g., Japanese Laid-Open Patent Publication No. 2007-067127).

Nonetheless, there is demand for reductions in the size and cost of a power semiconductor device in which a vertical power semiconductor device and a circuit unit are disposed on a single semiconductor substrate. To meet such demands, studies are being conducted to reduce chip size by reducing the size of the circuit unit (a control/protection circuit of the vertical power semiconductor device) and the vertical power semiconductor device through reduction of ON resistivity (RonA) per unit area; however, the following problem occurs.

If a contact size (a contact area between a metal wiring layer and a p$^+$-type diffusion region) of the horizontal p-channel MOSFET 122 making up a horizontal CMOS for a control circuit is made smaller so as to reduce the size of the circuit unit, this leads to deterioration in contact properties between the metal wiring layer and a semiconductor portion, such as a rise in contact resistivity (i.e., ON resistivity) of the metal wiring layer and the p$^+$-type diffusion region (i.e., the source electrode 116 and the p$^+$-type source region 112, and the drain electrode 117 and the p$^+$-type drain region 113). Therefore, to reduce the size of the circuit unit, measures have to be taken to improve the contact properties between the metal wiring layer and the semiconductor portion of the horizontal p-channel MOSFET 122; however, a problem of increased process cost newly arises.

On the other, if the resist mask 133 is used for forming the p$^+$-type diffusion region 108 as described above, the vertical n-channel power MOSFET 121 has the following problem. FIGS. 30, 31, and 32 are cross-sectional views of a state in which mask displacement occurs during manufacturing of a conventional semiconductor device. As depicted in FIG. 30, if the position of an open portion 133a of the resist mask 133 for forming the p$^+$-type diffusion region 108 is displaced from a predetermined position (in FIG. 30, mask displacement to the right as indicated by a white arrow), the p$^+$-type diffusion region 108 is formed at a position displaced from the predetermined position by an amount corresponding to the amount of displacement of the resist mask 133.

As depicted in FIG. 31, if the position of the open portion 135a of the resist mask 135 for forming the contact hole 110a is displaced in a direction opposite to the displacement direction of the open portion 133a of the resist mask 133 (in FIG. 31, a mask displacement to the left as indicated by a white arrow), the contact hole 110a is formed at position away from the p$^+$-type diffusion region 108. In this state, the p$^+$-type diffusion region 108 may not be exposed in the contact hole 110a depending on the extent of the mask displacement. In this case, as depicted in FIG. 32, the source electrode 110 (metal wiring layer) does not contact the p$^+$-type diffusion region 108 (a portion indicted by reference numeral 141), and the contact properties deteriorate between the metal wiring layer and the semiconductor portion.

Therefore, to make the source electrode 110 and the p$^+$-type diffusion region 108 contact each other, device design has to be performed using device dimensions that ensure margins for displacement of the resist mask 133 for forming the p$^+$-type diffusion region 108 and the resist mask 135 for forming the contact hole 110a. For example, a width of the contact hole 110a (width in the direction of arrangement of the trench 103; hereinafter, simply referred to as the width) must be set to a wide width obtained by adding a margin for mask displacement. However, particularly in vertical MOSFETs of a trench gate structure having a small cell pitch and contact size, ensuring the margins for mask displacement further inhibits reductions in size.

SUMMARY OF THE INVENTION

According to one aspect of the present invention, a method of manufacturing a semiconductor device having a vertical semiconductor device and a horizontal semiconductor device disposed on a single semiconductor substrate, where the vertical semiconductor device has a first semiconductor region of a second conductivity type and selectively disposed in a surface layer of a first side of the semiconductor substrate, the surface layer configuring a semiconductor layer of a first conductivity type, a second semiconductor region of the first conductivity type and selectively disposed inside the first semiconductor region, a first gate insulating film contacting the first semiconductor region at a portion between the semiconductor layer and the second semiconductor region, and a first gate electrode contacting the first gate insulating film; and the horizontal semiconductor device has a third semiconductor region of the second conductivity type and selectively disposed in the surface layer and away from the first semiconductor region, a fourth semiconductor region of the second conductivity type and selectively disposed in the surface layer and away from the first semiconductor region and the third semiconductor region, and a second gate electrode disposed on a surface of the semiconductor layer, in a portion interposed between the third semiconductor region and the fourth semiconductor region, the second gate electrode being disposed via a second gate insulating film, includes: forming the first gate insulating film and the second gate insulating film on the first side of the semiconductor substrate; forming the first gate electrode that contacts the first gate insulating film and the second gate electrode that contacts the second gate insulating film; selectively forming in the surface layer after forming the first gate electrode and the second gate electrode, the first semiconductor region that contacts the first gate insulating film; forming the third semiconductor region and the fourth semiconductor region in a self-aligning manner at the second gate electrode by performing ion implantation using the second gate electrode as a mask, after forming the first gate electrode and the second gate electrode; selectively forming the second semiconductor region inside the first semiconductor region after forming the third semiconductor region and the fourth semiconductor region; forming an interlayer dielectric on a principal surface of the semiconductor substrate after forming the second semiconductor region; forming contact holes by selectively removing the interlayer dielectric, and exposing the first semiconductor region, the third semiconductor region, and the fourth semiconductor region that respectively correspond to a different contact hole among the contact holes; respectively forming inside the first semiconductor region, the third semiconductor region, and the fourth semiconductor region by performing ion implantation through the contact holes, a first diffusion region that is of the second conductivity type and has an impurity concentration higher than that of the first semiconductor region, a second diffusion region that is of the second conductivity type and has an impurity concentration at least equal to that of the third semiconductor region, and a third diffusion region that is of the second conductivity type and has an impurity concentration at least equal to that of the fourth semiconductor region; and forming through the contact holes and after forming the first diffusion region, the second diffusion region, and the third diffusion region, a metal wiring layers that are respectively connected to the first diffusion region, the second diffusion region, and the third diffusion region.

In the method, in forming the contact holes, a contact hole for connecting the second diffusion region and a metal wiring layer among the metal wiring layers is formed toward an end portion of the third semiconductor region, which has a first side that is toward the second gate electrode and a second side that with respect to the first side, is an opposite side of the third semiconductor region, the end portion being on the second side of the third semiconductor region.

In the method, in forming the contact holes, a contact hole for connecting the third diffusion region and a metal wiring layer among the metal wiring layers is formed toward an end portion of the fourth semiconductor region, which has a first side that is toward the second gate electrode and a second side that with respect to the first side, is an opposite side of the fourth semiconductor region, the end portion being on the second side of the fourth semiconductor region.

The method further includes forming on the first side of the semiconductor substrate before forming the first gate insulating film and the second gate insulating film, a local insulating film that separates the vertical semiconductor device and the horizontal semiconductor device, where the second diffusion region extends from the third semiconductor region to a portion covered by residue of an end portion of the local insulating film removed consequent to exposure in a contact hole when exposing the third semiconductor region.

The method further includes forming on the first side of the semiconductor substrate before forming the first gate insulating film and the second gate insulating film, a local insulating film that separates the vertical semiconductor device and the horizontal semiconductor device, where the third diffusion region extends from the fourth semiconductor region to a portion covered by residue of an end portion of the local insulating film removed consequent to exposure in a contact hole when exposing the third semiconductor region.

The other objects, features, and advantages of the present invention are specifically set forth in or will become apparent from the following detailed description of the invention when read in conjunction with the accompanying drawings.

BRIEF DESCRIPTION OF THE DRAWINGS

FIG. 1 is a cross-sectional view of a structure of a semiconductor device according to a first embodiment;

FIGS. 2, 3, 4, and 5 are cross-sectional views of states during manufacturing of the semiconductor device according to the first embodiment;

FIG. 6 is a cross-sectional view of a structure of the semiconductor device according to a second embodiment;

FIGS. 7, 8, 9, 10, 11, 12, 13, 14, 15, and 16 are cross-sectional views of states during manufacturing of the semiconductor device according to the second embodiment;

FIGS. 17, 18, and 19 are cross sectional views of states in which mask displacement occurs during manufacturing of the semiconductor device according to the second embodiment;

FIG. 22 is an enlarged cross-sectional view of a state when a contact hole is formed on a $p^+$-type source region side of a horizontal p-channel MOSFET depicted in FIG. 6;

FIGS. 23 and 24 are enlarged cross-sectional views of a state when contact holes are formed on the $p^+$-type source region side of the horizontal p-channel MOSFET depicted in FIG. 25;

FIG. 25 is a cross-sectional view of a structure of the conventional semiconductor device;

FIGS. 26, 27, 28, and 29 are cross-sectional views of states during manufacturing of the conventional semiconductor device.

DETAILED DESCRIPTION OF THE INVENTION

Figure 11:
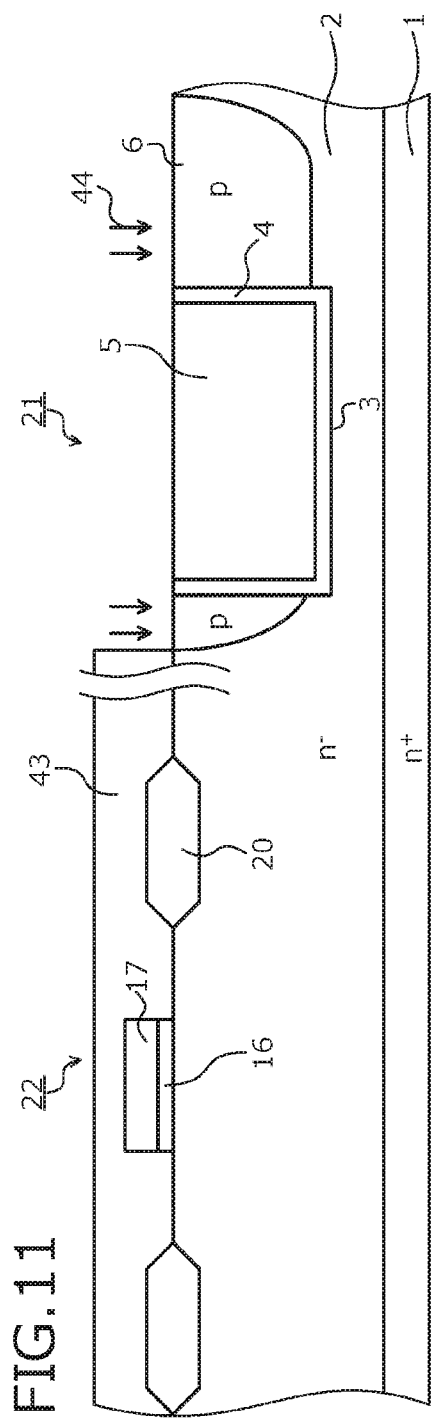

Preferred embodiments of a semiconductor device and a method of manufacturing a semiconductor device will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, identical constituent elements will be given the same reference numerals and will not be repeatedly described.

First Embodiment

A structure of a semiconductor device according to a first embodiment will be described taking as an example, a power semiconductor device that has a vertical n-channel power MOSFET for an output stage and a horizontal CMOS for a control circuit disposed on the same semiconductor substrate. FIG. 1 is a cross-sectional view of the structure of the semiconductor device according to the first embodiment. The semiconductor device depicted in FIG. 1 is an example of the power semiconductor device that has a vertical MOSFET of trench gate structure disposed as a vertical n-channel power MOSFET (vertical semiconductor device) 21 for an output stage. FIG. 1 depicts only a horizontal p-channel MOSFET (horizontal semiconductor device) 22 among the horizontal p-channel MOSFET 22 and a horizontal n-channel MOSFET complementarily connected to make up a horizontal CMOS for a control circuit (similarly in FIGS. 2 to 19).

As depicted in FIG. 1, a vertical n-channel power MOSFET 21 for an output stage and a horizontal CMOS for a control circuit for controlling the vertical n-channel power MOSFET 21 are disposed on a single epitaxial substrate (semiconductor chip) formed by epitaxial growth of an $n^-$-type semiconductor layer 2 on an $n^+$-type semiconductor layer 1. A structure of the vertical n-channel power MOSFET 21 will first be described. In the vertical n-channel power MOSFET 21, the $n^+$-type semiconductor layer 1 acts as a drain region and the $n^-$-type semiconductor layer 2 acts as a drift region. In the $n^-$-type semiconductor layer 2, a trench 3 is disposed to a depth that does not reach the $n^+$-type semiconductor layer 1 from a substrate front surface (a surface on the $n^-$-type semiconductor layer 2 side of the epitaxial substrate) in a depth direction. In the trench 3, a gate insulating film 4 is disposed along an inner wall of the trench 3 and a gate electrode 5 made of, for example, polysilicon (poly-Si) is disposed inside the gate insulating film 4.

A p-type base region (first semiconductor region) 6 is selectively disposed in a surface layer of the substrate front surface side of the $n^-$-type semiconductor layer 2. The p-type base region 6 is disposed to contact the gate insulating film 4 disposed on a side wall of the trench 3 and faces the gate electrode 5 via the gate insulating film 4. In the p-type base region 6, both an $n^+$-type source region (second semiconductor region) 7 and a $p^+$-type diffusion region (first diffusion region) 8 are selectively disposed in the surface layer of the substrate front surface side. The $n^+$-type source region 7 is disposed to contact the gate insulating film (first gate insulating film) 4 disposed on the side wall of the trench 3 and faces the gate electrode (first gate electrode) 5 via the gate insulating film 4. The $p^+$-type diffusion region 8 contacts a source electrode 10 described later and acts as a contact region electrically connecting the $n^+$-type source region 7 and the source electrode 10.

The $p^+$-type diffusion region 8 has a function of reducing contact resistivity of the p-type base region 6 and the source electrode 10, and has a function of increasing avalanche tolerance. To effectively obtain these functions, the $p^+$-type diffusion region 8 is preferably disposed to have an impurity concentration that is higher than that of the p-type base region 6 and a diffusion depth that is deeper than that of the $n^+$-type source region 7. By disposing the $p^+$-type diffusion region 8, a hole (an electron hole) generated at the time of avalanche breakdown of the vertical n-channel power MOSFET 21 can easily move to the source electrode 10 and a voltage drop when the hole passes through the p-type base region 6 can be suppressed. This enables suppression of the parasitic bipolar transistor behavior of the $n^-$-type semiconductor layer 2, the p-type base region 6, and the $n^+$-type source region 7 causing avalanche destruction and therefore, enables increased avalanche tolerance.

An interlayer dielectric 9 is disposed on the substrate front surface and covers the gate electrode 5, the p-type base region 6, the $n^+$-type source region 7, and the $p^+$-type diffusion region 8. In the interlayer dielectric 9, a contact hole 10a that penetrates the interlayer dielectric 9 in the depth direction and reaches the $p^+$-type diffusion region 8 is disposed. The source electrode 10 is a metal wiring layer that contacts the $p^+$-type diffusion region 8 through the contact hole 10a and contacts the $n^+$-type source region 7 through a contact hole (not depicted) in a portion not depicted. The source electrode 10 is electrically insulated from the gate electrode 5, by the interlayer dielectric 9. A back surface electrode 11 acting as a drain electrode is disposed on a back surface of the epitaxial substrate (a surface on the side of the $n^+$-type semiconductor layer 1). The back surface electrode 11 is contacts the entire back surface of the epitaxial substrate.

A structure of the horizontal p-channel MOSFET 22 making up the horizontal CMOS will be described. The horizontal p-channel MOSFET 22 is separated from the vertical n-channel power MOSFET 21 by a local insulating film such as a LOCOS film 20, for example. In the horizontal p-channel MOSFET 22, the $n^-$-type semiconductor layer 2 acts as a base region. In the $n^-$-type semiconductor layer 2, a $p^+$-type source region (third semiconductor region) 12 and a $p^+$-type drain region (fourth semiconductor region) 13 are selectively disposed in a surface layer on the substrate front surface side (the surface of the $n^-$-type semiconductor layer 2 side of the epitaxial substrate). The $p^+$-type source region 12 and the $p^+$-type drain region 13 are $p^+$-type diffusion regions (Psd) formed at end portions of a gate electrode 17 in a self-aligning manner by ion implantation that uses, as a mask, the gate electrode (second gate electrode) 17 described later and disposed on the substrate front surface.

In the $p^+$-type source region 12, a $p^+$-type diffusion region (second diffusion region) 14 is selectively disposed. The $p^+$-type diffusion region 14 may be disposed inside the $p^+$-type source region 12 and the position inside the $p^+$-type source region 12 can be changed variously. The $p^+$-type diffusion region 14 contacts a source electrode 18 described later and electrically connects the $p^+$-type source region 12 and the source electrode 18. The depth of the $p^+$-type diffusion region 14 can be changed variously according to design conditions. For example, although the depth of the $p^+$-type diffusion region 14 is depicted to be deeper than the $p^+$-type source region 12, the depth of the $p^+$-type diffusion region 14 may be the same as the depth of the $p^+$-type source region 12 or may be shallower than the $p^+$-type source region 12.

The impurity concentration of the $p^+$-type diffusion region 14 is equal to or higher than the impurity concentration of the $p^+$-type source region 12. Therefore, by disposing the $p^+$-type diffusion region 14 to overlap the $p^+$-type source region 12, the $p^+$-type source region 12 partially has a high impurity concentration. As a result, the contact resistivity of the $p^+$-type diffusion region 14 and the source electrode 18 is reduced as compared to a case where the $p^+$-type diffusion region 14 is not disposed inside the $p^+$-type source region 12 (i.e., a case where only the $p^+$-type source region 12 is disposed). Therefore, contact properties are improved between the $p^+$-type source region 12 and the source electrode 18.

In the $p^+$-type drain region 13, a $p^+$-type diffusion region (third diffusion region) 15 is selectively disposed. The $p^+$-type diffusion region 15 may be disposed inside the $p^+$-type drain region 13 and the position inside the $p^+$-type drain region 13 can be changed variously. The $p^+$-type diffusion region 15 contacts a drain electrode 19 described later and electrically connects the $p^+$-type drain region 13 and the drain electrode 19. The depth of the $p^+$-type diffusion region 15 can be changed variously according to design conditions. For example, although the depth of the $p^+$-type diffusion region 15 is depicted to be deeper than the p$^+$-type drain region 13, the depth of the p$^+$-type diffusion region 15 may be the same as the depth of the p$^+$-type drain region 13 or may be shallower than the p$^+$-type drain region 13.

The impurity concentration of the p$^+$-type diffusion region 15 is equal to or higher than the impurity concentration of the p$^+$-type drain region 13. Therefore, by disposing the p$^+$-type diffusion region 15 to overlap the p$^+$-type drain region 13, the p$^+$-type drain region 13 partially has a high impurity concentration. As a result, the contact resistivity of the p$^+$-type diffusion region 15 and the drain electrode 19 is reduced as compared to a case where the p$^+$-type diffusion region 15 is not disposed inside the p$^+$-type drain region 13 (i.e., a case where only the p$^+$-type drain region 13 is disposed). Therefore, contact properties are improved between the p$^+$-type drain region 13 and the drain electrode 19.

On a surface of the n$^-$-type semiconductor layer 2, in a portion between the p$^+$-type source region 12 and the p$^+$-type drain region 13, the gate electrode 17 made of, for example, polysilicon (poly-Si) is disposed via a gate insulating film (second gate insulating film) 16. The interlayer dielectric 9 is disposed on the substrate front surface from the vertical n-channel power MOSFET 21 to the horizontal p-channel MOSFET 22 so as to cover the p$^+$-type source region 12, the p$^+$-type drain region 13, the p$^+$-type diffusion regions 14, 15, and the gate electrode 17. In the interlayer dielectric 9, contact holes 18a, 19a that penetrate the interlayer dielectric 9 in the depth direction and reach the p$^+$-type diffusion regions 14, 15 are disposed.

The positions of the contact holes 18a, 19a in a lateral direction (a flow direction of drain current) have to be set so as not to expose the gate electrode 17 when a mask displacement occurs. Therefore, for example, the arrangement of the contact holes 18a, 19a may be designed such that the distance from the gate electrode 17 to the contact holes 18a, 19a becomes longer than the distance from the contact holes 18a, 19a to the LOCOS film 20. The source electrode 18 is a metal wiring layer that contacts the p$^+$-type diffusion region 14 through the contact hole 18a. The drain electrode 19 is a metal wiring layer that contacts the p$^+$-type diffusion region 15 through the contact hole 19a. The source electrode 18 and the drain electrode 19 are electrically insulated by the interlayer dielectric 9 from the gate electrode 17.

A method of manufacturing the semiconductor device according to the first embodiment will be described. FIGS. 2, 3, 4, and 5 are cross-sectional views of states during manufacturing of the semiconductor device according to the first embodiment. First, as depicted in FIG. 2, a semiconductor wafer (epitaxial wafer) is prepared that is formed by laminating the n$^+$-type semiconductor layer 1 and the n$^-$-type semiconductor layer 2. Subsequently, in a formation region of the vertical n-channel power MOSFET 21 on the front surface side (on the n$^-$-type semiconductor layer 2 side) of the semiconductor wafer, a MOS gate structure is formed that is made up of the p-type base region 6, the n$^+$-type source region 7, the trench 3, the gate insulating film 4, and the gate electrode 5. In a formation region of the horizontal p-channel MOSFET 22 on the front surface of the semiconductor wafer, the gate electrode 17 is formed via the gate insulating film 16. A method of forming the MOS gate structure, the gate insulating film 16, and the gate electrode 17 is the same as a method of manufacturing a semiconductor device according to a second embodiment described later, for example.

Subsequently, on the front surface of the semiconductor wafer, a resist mask 31 is formed that is open from a portion corresponding to the formation region of the p$^+$-type source region 12 to a portion corresponding to the formation region of the p$^+$-type drain region 13 of the horizontal p-channel MOSFET 22. By using the resist mask 31 and the gate electrode 17 as a mask, ion implantation 32 of a p-type impurity is performed to form in a self-aligning manner at the end portions of the gate electrode 17 of the horizontal p-channel MOSFET 22, p$^+$-type diffusion regions (Psd) that respectively become the p$^+$-type source region 12 and the p$^+$-type drain region 13. After the resist mask 31 is removed, the p$^+$-type source region 12 and the p$^+$-type drain region 13 of the horizontal p-channel MOSFET 22 are diffused by heat treatment.

Subsequently, as depicted in FIG. 3, a resist mask 33 is formed that is open in a portion corresponding to the formation region of the p$^+$-type diffusion regions 8, 14, 15. By using the resist mask 33 as a mask, ion implantation 34 of a p-type impurity is performed to form the p$^+$-type diffusion region 8 inside the p-type base region 6, and the p$^+$-type diffusion regions 14, 15 are formed inside the p$^+$-type source region 12 and the p$^+$-type drain region 13, respectively. Therefore, the p$^+$-type diffusion region 8 acting as the contact region of the vertical n-channel power MOSFET 21, and the p$^+$-type diffusion regions 14, 15 acting as the contact region of the horizontal p-channel MOSFET 22 are formed by the same ion implantation 34. After the resist mask 33 is removed, the p$^+$-type diffusion regions 8, 14, 15 are diffused by heat treatment.

Subsequently, as depicted in FIG. 4, the interlayer dielectric 9 of Borophosphosilicate glass (BPSG), etc. is formed on the entire front surface of the semiconductor wafer. On the interlayer dielectric 9, a resist mask 35 is formed that is open in portions corresponding to formation regions of the contact holes 10a, 18a, and 19a. The resist mask 35 is used as a mask and the interlayer dielectric 9 is etched to form the contact holes 10a, 18a, 19a. The resist mask 35 is then removed. As a result, the p$^+$-type diffusion regions 8, 14, 15 are exposed in the contact holes 10a, 18a, 19a. As depicted in FIG. 1, a width of the contact hole 10a depicted in FIGS. 4 and 5 may be a width that exposes the p$^+$-type diffusion region 8 alone and at a portion not depicted, the n$^+$-type source region 7 may be exposed.

Subsequently, as depicted in FIG. 5, for example, a metal wiring layer made of an alloy of aluminum and silicon (Al—Si) is formed to be embedded in the contact holes 10a, 18a, 19a. This metal wiring layer is patterned to leave a portion that becomes the source electrode 10 of the vertical n-channel power MOSFET 21 and portions that become the source electrode 18 and the drain electrode 19 of the horizontal p-channel MOSFET 22. On the entire back surface of the semiconductor wafer (the surface of the n$^+$-type semiconductor layer 1 side of the semiconductor wafer), the back surface electrode 11 is formed as the drain electrode of the vertical n-channel power MOSFET 21. Subsequently, the semiconductor wafer is diced (cut) into individual chip shapes to complete the semiconductor device depicted in FIG. 1.

As described above, according to the first embodiment, since a semiconductor device that has an output stage device and a circuit unit for controlling this output stage device disposed on the same semiconductor substrate has a p$^+$-type diffusion region formed inside Psd (a p$^+$-type source region and a p$^+$-type drain region) of a horizontal p-channel MOSFET making up the circuit unit so that the Psd can partially have a high impurity concentration, the contact properties can be improved between a metal wiring layer and the Psd even when a contact hole for connecting the metal wiring layer and the Psd is reduced in width so as to achieve size reductions. Therefore, in the horizontal p-channel MOSFET making up the circuit unit, the contact hole for connecting the metal wiring layer and the Psd can be reduced in width for finer cell pitches. Thus, the semiconductor chip can be reduced in size.

For example, the first embodiment enables mask dimensions to be reduced to the following values as compared to conventional cases. In the conventional semiconductor devices, the width of the contact holes is set to 2.0 μm and the distances are set to 1.5 μm and 2.0 μm between the gate electrode and the contact holes and between the contact holes and the LOCOS film, respectively. On the other hand, in the first embodiment, the width of the contact holes can be set to 0.7 μm and the distances can be set to 1.0 μm and 2.0 μm between the gate electrode and the contact holes and between the contact holes and the LOCOS film, respectively. As described above, the first embodiment enables a reduction in the width of the contact holes of the horizontal p-channel MOSFET making up the circuit unit as compared to the conventional cases.

In the first embodiment, the vertical n-channel power MOSFET acting as the output stage device is formed as a trench gate structure and therefore, can be reduced in size as compared to a case where the vertical n-channel power MOSFET acting as the output stage device is formed as a planar gate structure, and the semiconductor chip can be reduced further in size. In the first embodiment, the $p^+$-type diffusion regions formed inside the Psd of the horizontal p-channel MOSFET can be formed by ion implantation at the same time as the $p^+$-type diffusion region acting as the contact region of the vertical n-channel power MOSFET that is the output stage device and, therefore, it is not necessary to add a new step for forming the $p^+$-type diffusion regions inside the Psd of the horizontal p-channel MOSFET. Therefore, cost increases can be prevented.

Second Embodiment

The method of manufacturing a semiconductor device according to a second embodiment will be described. FIG. 6 is a cross-sectional view of a structure of the semiconductor device according to the second embodiment. FIGS. 7, 8, 9, 10, 11, 12, 13, 14, 15, and 16 are cross-sectional views of states during manufacturing of the semiconductor device according to the second embodiment. Although the vertical n-channel power MOSFET 21 depicted in FIG. 6 is depicted as a slightly different cross-sectional structure from the vertical n-channel power MOSFET 21 produced (manufactured) in the manufacturing steps depicted in FIGS. 7 to 16, the same vertical n-channel power MOSFET 21 is represented. The method of manufacturing a semiconductor device according to the second embodiment is different from the method of manufacturing a semiconductor device according to the first embodiment in that after the contact holes 10a, 18a, 19a are formed in the interlayer dielectric 9, ion implantation 49 of a p-type impurity is performed through the contact holes 10a, 18a, 19a (by using the interlayer dielectric 9 as the mask) to form $p^+$-type diffusion regions 28, 24, 25.

For example, first, as depicted in FIG. 7, a semiconductor wafer (epitaxial wafer) is prepared that is formed by stacking the $n^+$-type semiconductor layer 1 and the $n^-$-type semiconductor layer 2. Subsequently, on a front surface of the semiconductor wafer (a surface on the $n^-$-type semiconductor layer 2 side), a protective film (not depicted) is formed that is made of a thermal oxide film ($SiO_2$ film) (or a stacked film formed by sequentially stacking a thermal oxide film and a silicon nitride film (SiN film)). The protective film is then selectively removed by photolithography and etching to expose a portion corresponding to the formation region of the trench 3 of the vertical n-channel power MOSFET 21. Etching is performed by using the remainder of the protective film as the mask to form the trench 3 of the vertical n-channel power MOSFET 21. The protective film used for forming the trench 3 is then removed.

Subsequently, as depicted in FIG. 8, a silicon nitride film (not depicted) is deposited on the front surface of the semiconductor wafer and the silicon nitride film is selectively removed by photolithography and etching to expose a portion corresponding to the formation region of the LOCOS film 20. The remainder of the silicon nitride film is used as the mask to thermally oxidize a silicon (Si) portion exposed in an open portion of the silicon nitride film through a LOCOS technique to locally form an oxide film ($SiO_2$ film) as the LOCOS film 20. This LOCOS film 20 divides the formation region of the vertical n-channel power MOSFET 21 and the formation region of the horizontal p-channel MOSFET 22. The silicon nitride film used for forming the LOCOS film 20 is removed.

Subsequently, as depicted in FIG. 9, a silicon portion exposed on the front surface of the semiconductor wafer is thermally oxidized to form an oxide film ($SiO_2$ film) 41 along the front surface of the semiconductor wafer and the inner wall of the trench 3. On the front surface of the semiconductor wafer, for example, a polysilicon (poly-Si) layer 42 is formed to be embedded inside the trench 3. As depicted in FIG. 10, the polysilicon layer 42 is patterned by photolithography and etching to leave a portion to be the gate electrode 5 of the vertical n-channel power MOSFET 21 and a portion to be the gate electrode 17 of the horizontal p-channel MOSFET 22. The oxide film 41 is patterned by the etching to leave a portion that becomes the gate insulating film 4 of the vertical n-channel power MOSFET 21 and a portion that becomes the gate insulating film 16 of the horizontal p-channel MOSFET 22.

Figure 12:
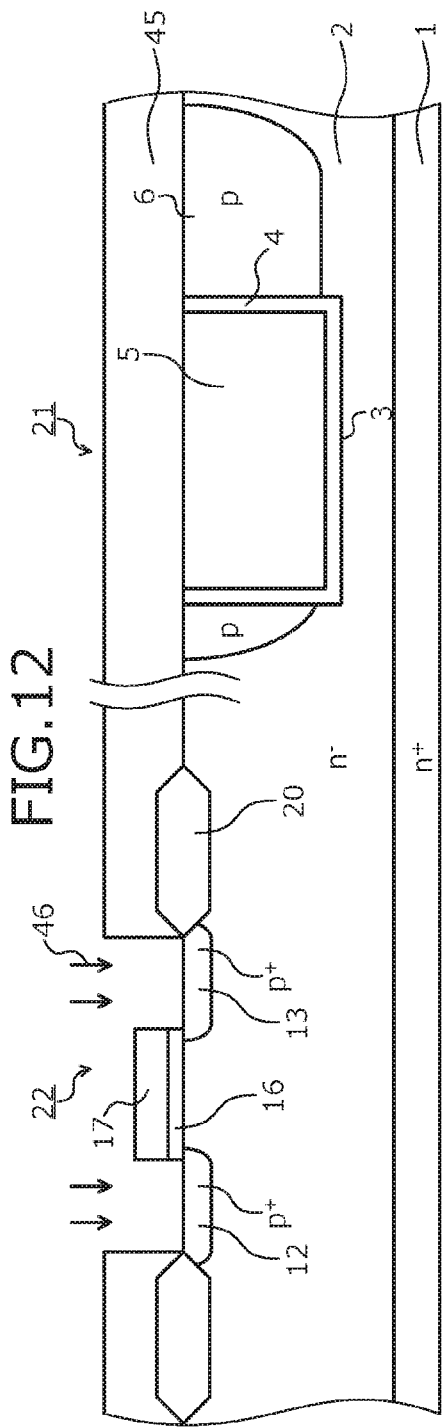

Subsequently, as depicted in FIG. 11, on the front surface of the semiconductor wafer, a resist mask 43 is formed that is open in a portion corresponding to the formation region of the p-type base region 6 of the vertical n-channel power MOSFET 21. By using the resist mask 43 as a mask, ion implantation 44 of p-type impurities is performed to form the p-type base region 6 of the vertical n-channel power MOSFET 21. After the resist mask 43 is removed, the p-type base region 6 of the vertical n-channel power MOSFET 21 is diffused by heat treatment. Subsequently, as depicted in FIG. 12, on the front surface of the semiconductor wafer, a resist mask 45 is formed that is open from a portion corresponding to the formation region of the $p^+$-type source region 12 to a portion corresponding to the formation region of the $p^+$-type drain region 13 of the horizontal p-channel MOSFET 22.

By using the resist mask 45 and the gate electrode 17 as a mask, ion implantation 46 of a p-type impurity is performed to form $p^+$-type diffusion regions (Psd) that become the $p^+$-type source region 12 and the $p^+$-type drain region 13 in a self-aligning manner at the respective end portions of the gate electrode 17 of the horizontal p-channel MOSFET 22. The resist mask 45 is removed. Subsequently, as depicted in FIG. 13, on the front surface of the semiconductor wafer, a resist mask 47 is formed that is open in a portion corresponding to the formation region of the $n^+$-type source region 7 of the vertical n-channel power MOSFET 21. By using the resist mask 47 as a mask, ion implantation 48 of an n-type impurity is performed to form the n+-type source region 7 of the vertical n-channel power MOSFET 21.

After the resist mask 47 is removed, the n+-type source region 7 of the vertical n-channel power MOSFET 21 and the p+-type source region 12 and the p+-type drain region 13 of the horizontal p-channel MOSFET 22 are diffused by heat treatment. Subsequently, as depicted in FIG. 14, the interlayer dielectric 9 of BPSG, etc. is formed on the entire front surface of the semiconductor wafer. Subsequently, as depicted in FIG. 15, the interlayer dielectric 9 is selectively removed by photolithography and etching to form the contact holes 10a, 18a, 19a that penetrate the interlayer dielectric 9 in the depth direction. As a result, the p-type base region 6, the p+-type source region 12, and the p+-type drain region 13 are exposed in the contact holes 10a, 18a, and 19a, respectively.

Subsequently, as depicted in FIG. 16, the ion implantation 49 of a p-type impurity is performed through the contact holes 10a, 18a, 19a (by using the interlayer dielectric 9 as the mask), into a silicon portion to form the p+-type diffusion region 28 inside the p-type base region 6 as well as the p+-type diffusion regions 24 and 25 inside the p+-type source region 12 and the p+-type drain region 13, respectively (a so-called plug implantation method). As a result, the p+-type diffusion regions 28, 24, 25 are formed in a self-aligning manner immediately under the contact holes 10a, 18a, 19a, respectively, so that the p+-type diffusion regions 28, 24, 25 are exposed in the contact holes 10a, 18a, 19a, respectively. These p+-type diffusion regions 28, 24, 25 are formed to have substantially the same widths as the contact holes 10a, 18a, 19a, respectively. The p+-type diffusion regions 28, 24, 25 are then diffused by heat treatment.

Subsequently, a metal wiring layer (not depicted) is formed to be embedded in the contact holes 10a, 18a, 19a. This metal wiring layer is patterned to leave a portion that becomes the source electrode 10 of the vertical n-channel power MOSFET 21 and portions that become the source electrode 18 and the drain electrode 19 of the horizontal p-channel MOSFET 22. On the entire back surface of the semiconductor wafer (the surface of the n+-type semiconductor layer 1 side of the semiconductor wafer), the back surface electrode 11 is formed as the drain electrode of the vertical n-channel power MOSFET 21. Subsequently, the semiconductor wafer is diced (cut) into individual chip shapes to complete the semiconductor device depicted in FIG. 6.

By forming the p+-type diffusion regions 28, 24, 25 through the contact holes 10a, 18a, 19a as described above, the metal wiring layers can be reliably brought into contact with the p+-type diffusion regions 28, 24, 25. Therefore, the contact properties can be improved between the vertical n-channel power MOSFET 21 and the horizontal p-channel MOSFET 22. Since the need for considering the mask displacement is eliminated in terms of the mask for forming the p+-type diffusion regions 28, 24, 25 and the mask for forming the contact holes (i.e., the interlayer dielectric 9), the vertical n-channel power MOSFET 21 and the horizontal p-channel MOSFET 22 can be reduced in size for the following reasons.

Figure 18:
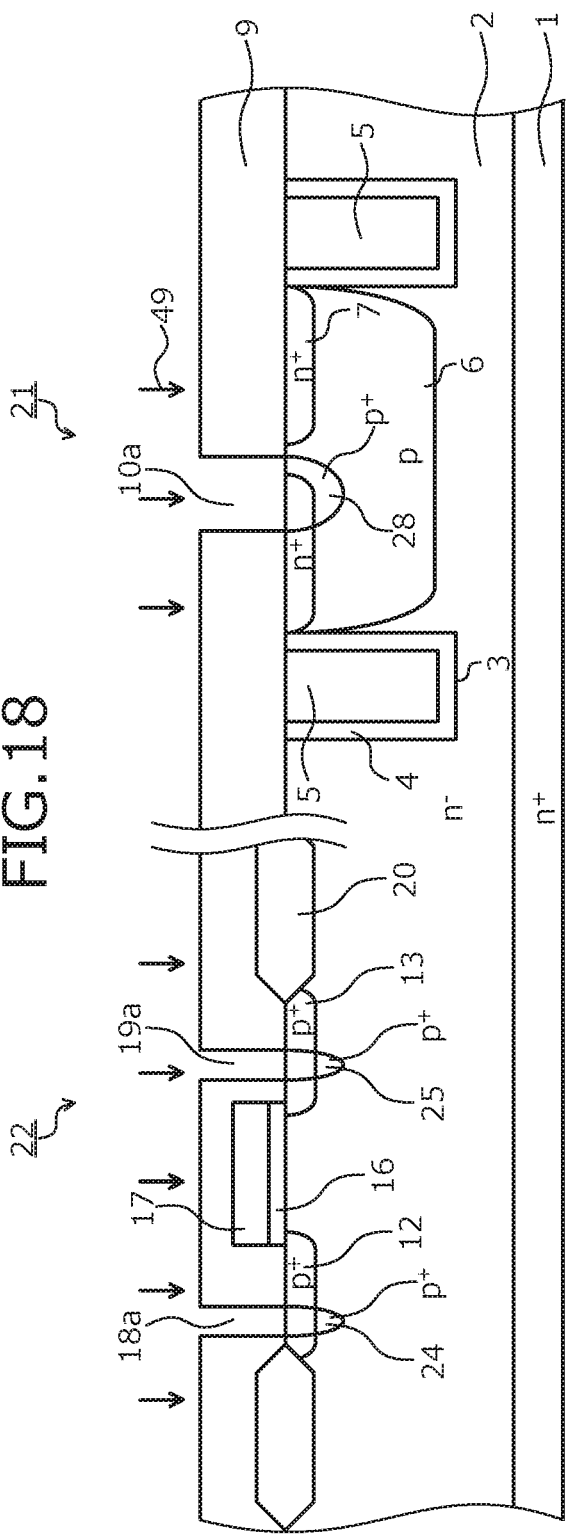
Figure 20A:
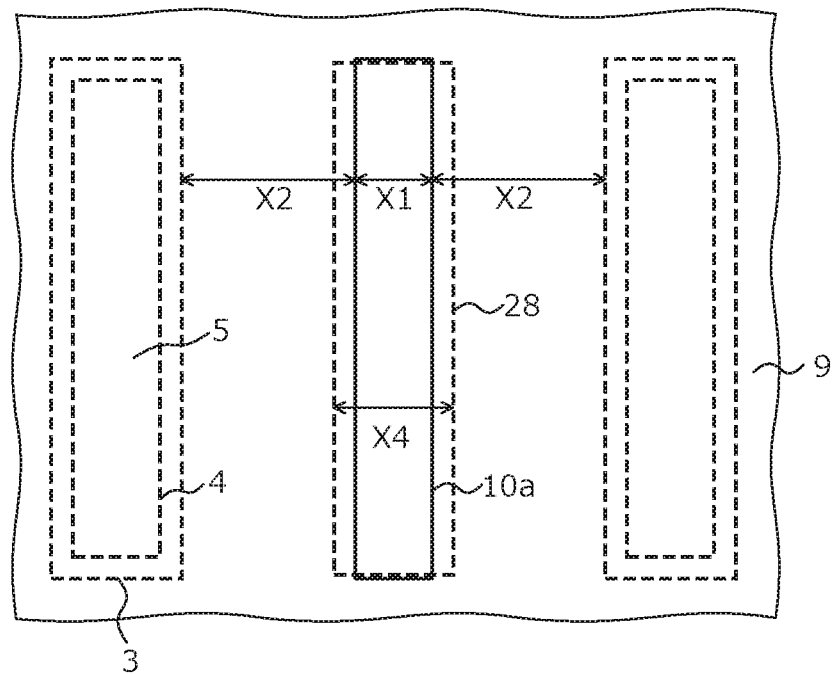
FIGS. 20A and 20B are explanatory views of a mask pattern of a mask used in manufacturing of the semiconductor device according to the second embodiment.
Figure 20B:
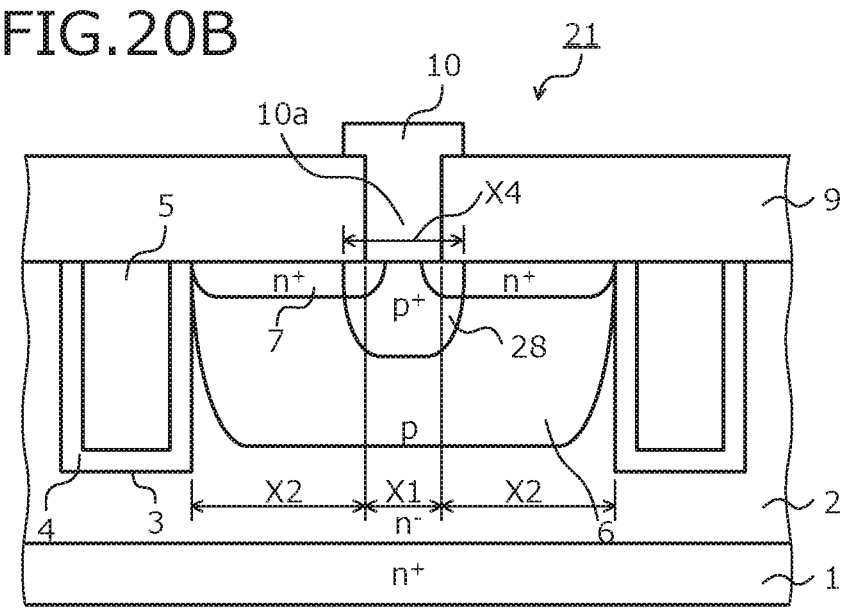
Figure 21A:
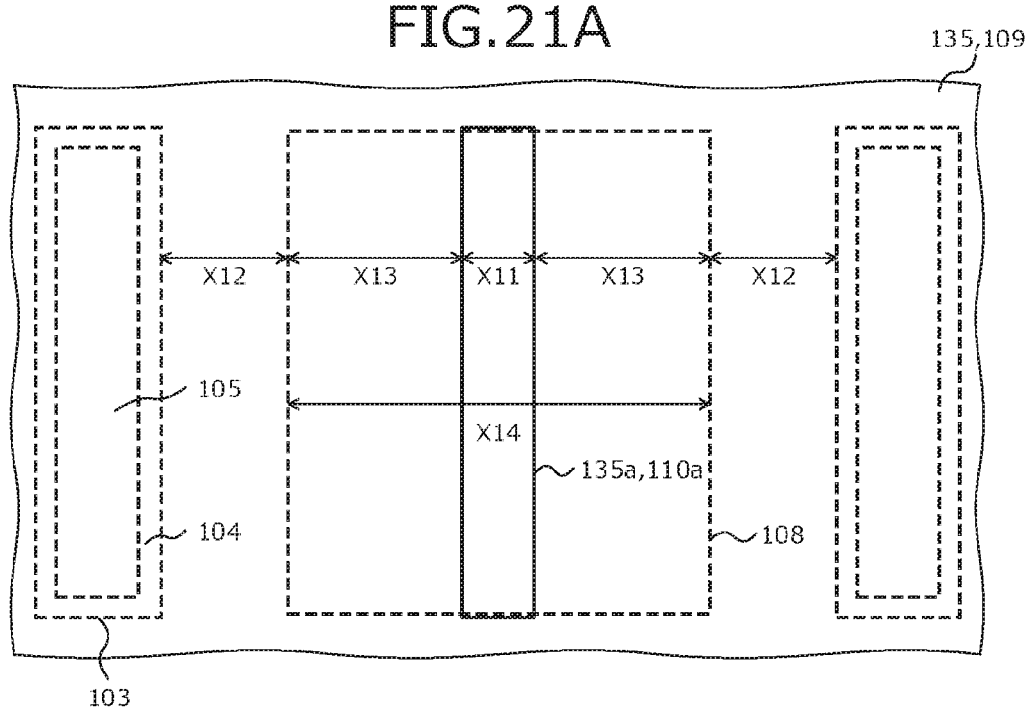
FIGS. 21A and 21B are explanatory views of a mask pattern of a mask used in manufacturing of a conventional semiconductor device.
Figure 21B:
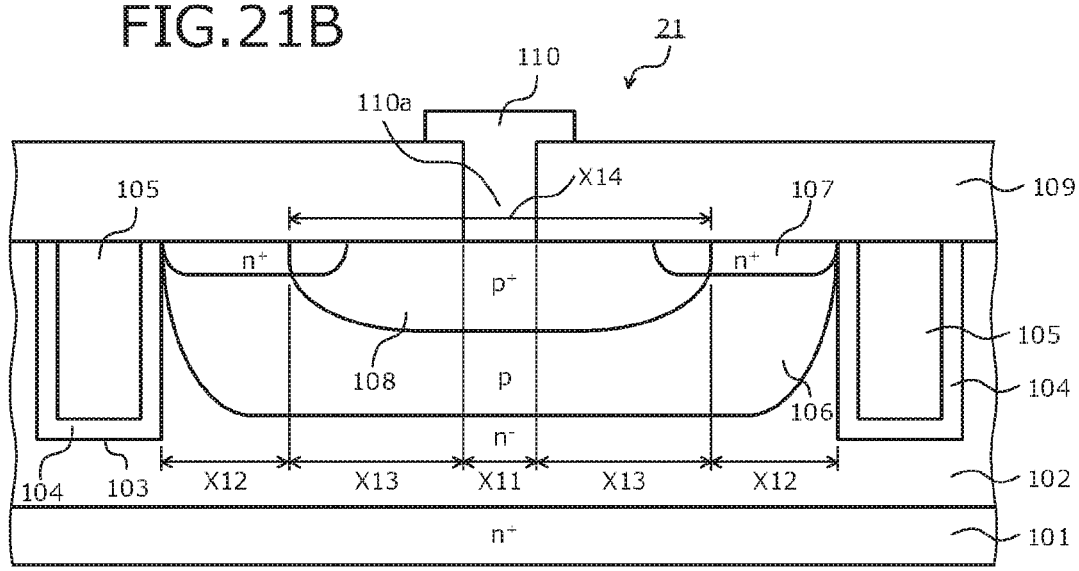
Figure 29:
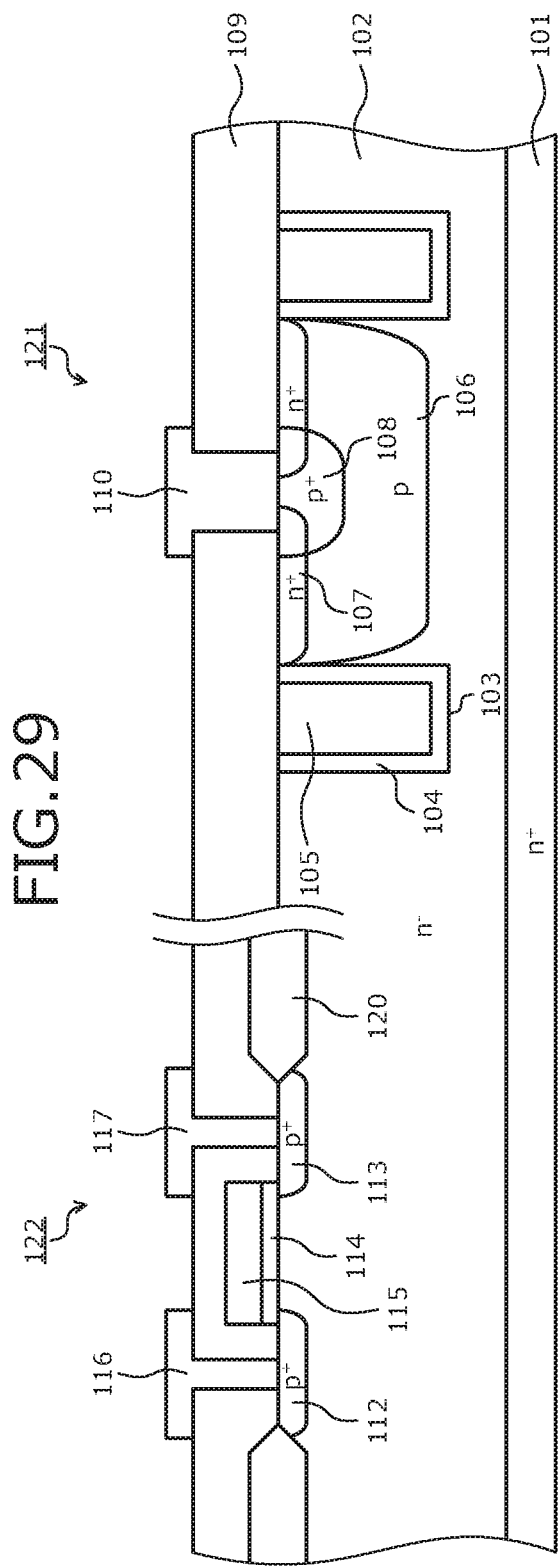

FIGS. 17, 18, and 19 are cross sectional views of states in which mask displacement occurs during manufacturing of the semiconductor device according to the second embodiment. FIGS. 20A and 20B are explanatory views of a mask pattern of a mask used in manufacturing of the semiconductor device according to the second embodiment. FIGS. 21A and 21B are explanatory views of a mask pattern of a mask used in manufacturing of a conventional semiconductor device (see FIG. 25). FIGS. 20A and 21A are plane views of the mask patterns for forming contact holes of vertical n-channel power MOSFETs. In particular, FIG. 20A is a top view of FIG. 16 and FIG. 21A is a top view of FIG. 28. FIGS. 20B and 21B are cross-sectional views of cross-sectional structures of vertical n-channel power MOSFETs fabricated by using the mask patterns of FIGS. 20A and 21A.

Figure 30:
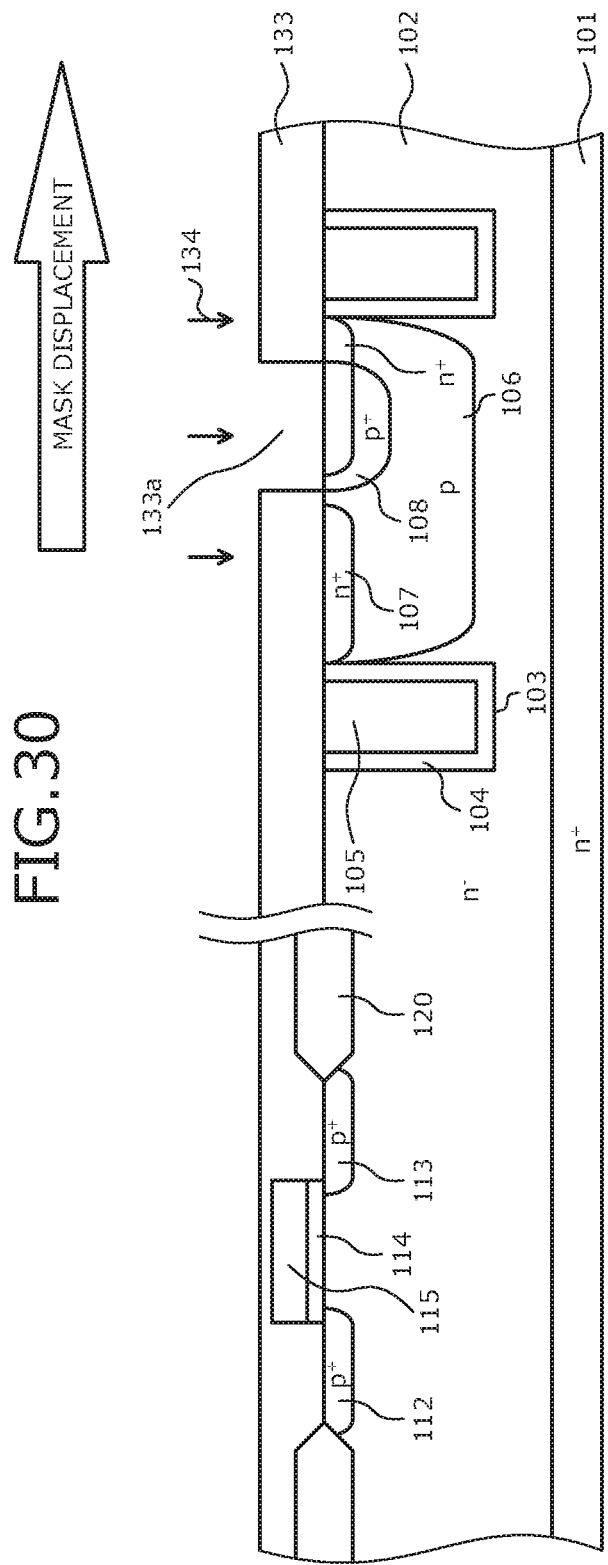
FIGS. 30, 31, and 32 are cross-sectional views of a state in which mask displacement occurs during manufacturing of the conventional semiconductor device.
Figure 31:
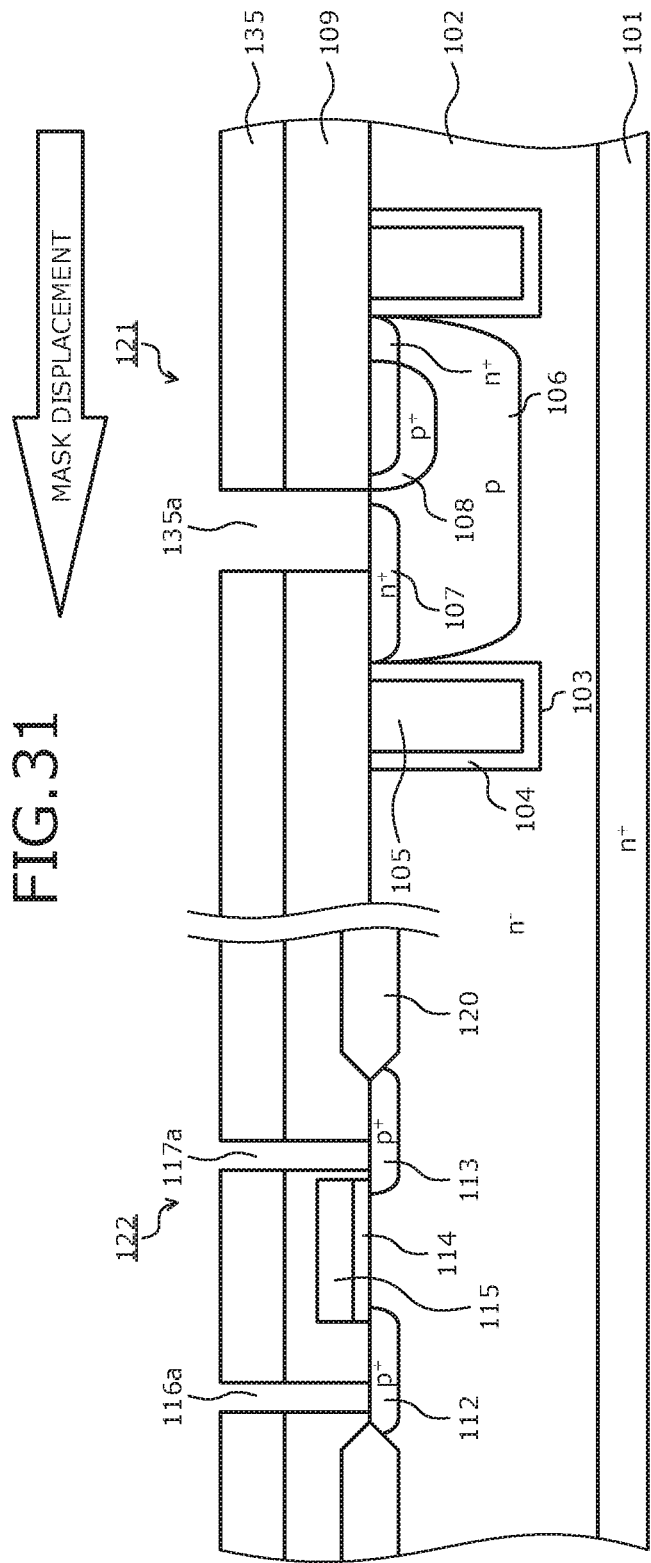
Figure 32:
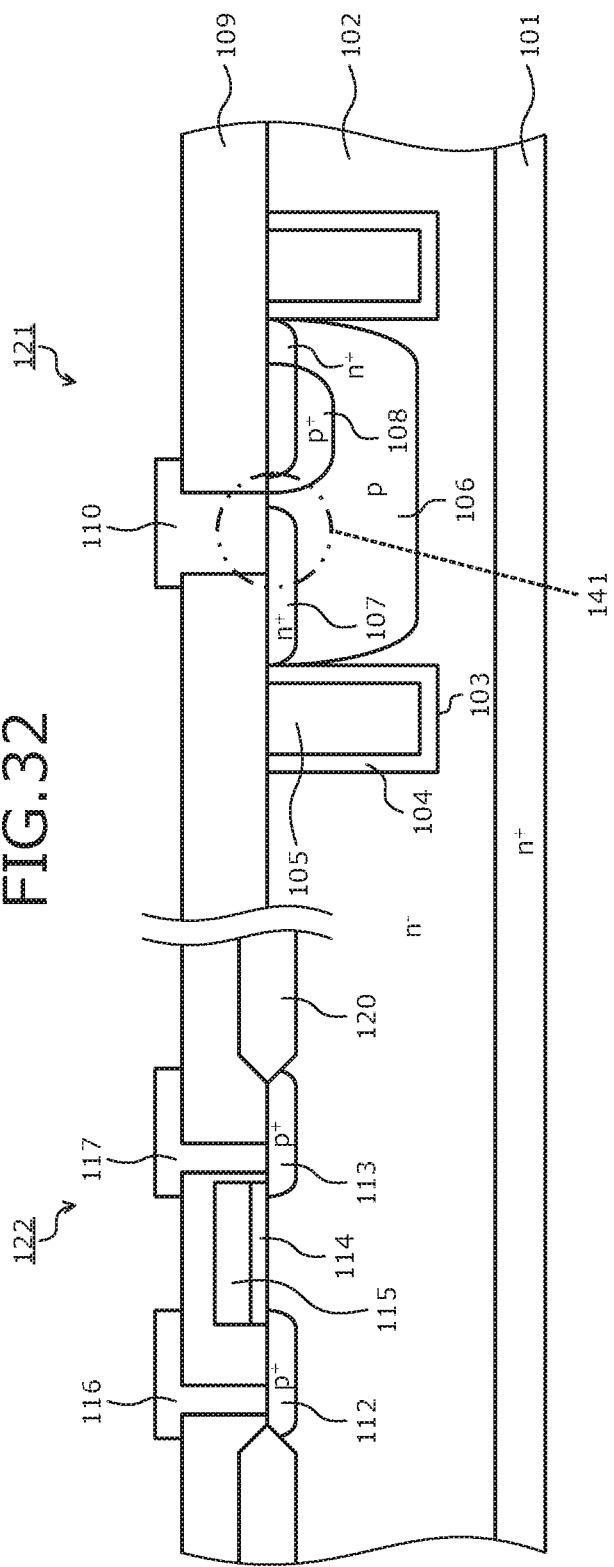

First, description will be made of a case where mask displacement occurs in the resist mask 133 for forming the p+-type diffusion region 108 and the resist mask 135 for forming the contact hole 110a of the vertical n-channel power MOSFET 121 as described above in the method of manufacturing the conventional semiconductor device depicted in FIG. 25 (see FIGS. 30 to 32). If no consideration is given to a margin for the mask displacement or the margin for the mask displacement is insufficient in the method of manufacturing the conventional semiconductor device, as depicted in FIG. 32, the source electrode 110 (metal wiring layer) does not contact the p+-type diffusion region 108 (a portion indicted by reference numeral 141). In this case, the contact properties significantly deteriorate between the source electrode 110 and the p+-type diffusion region 108.

Therefore, if consideration is given to a margin for the mask displacement in the method of manufacturing the conventional semiconductor device, as depicted in FIGS. 21A and 21B, a width X14 of the p+-type diffusion region 108 (i.e., width of the open portion 133a of the resist mask 133 (width in the direction of arrangement of the trench 103)) is set to a width obtained by adding a margin X13 for the mask displacement to a width X11 of the contact hole 110a (i.e., width of the open portion 135a of the resist mask 135) (X14=X11+2·X13). In particular, the width 14 of the p+-type diffusion region 108 has to be made wider by the margin X13 than the width X11 of the contact hole 110a so that the source electrode 110 contacts the p+-type diffusion region 108 even if the mask displacement has occurred. Reference numeral X12 denotes a distance between the trench 103 and the p+-type diffusion region 108.

On the other hand, in the method of manufacturing the semiconductor device according to the second embodiment, even when the position of an open portion 50a of a resist mask 50 for forming the contact hole 10a of the vertical n-channel power MOSFET 21 is displaced from a predetermined position as depicted in FIG. 17 (in FIG. 17, a mask displacement to the left as indicted by a white arrow), the ion implantation 49 is performed for forming the p+-type diffusion region 28 through the contact hole 10a as depicted in FIG. 18. As a result, the p+-type diffusion region 28 is formed in a self-aligning manner immediately under the contact hole 10a (a semiconductor portion exposed inside the contact hole 10a). Therefore, subsequently, the source electrode 10 (metal wiring layer) embedded inside the contact hole 10a reliably contacts the p+-type diffusion region 28 as depicted in FIG. 19, and the contact properties are ensured between the source electrode 10 and the p+-type diffusion region 28 (a portion indicted by reference numeral 51).

Therefore, in the method of manufacturing the semiconductor device according to the second embodiment, it is not necessary to give consideration to the margin for mask displacement when device design is performed. In particular, as depicted in FIGS. 20A and 20B, a width X4 of the p+-type diffusion region 28 is equal to a width X1 of the contact hole 10a. More specifically, the width X4 of the p+-type diffusion region 28 is laterally widened due to thermal diffusion of the p+-type diffusion region 28 and therefore, becomes slightly wider than the width X1 of the contact hole 10a. Thus, the width X4 of the p+-type diffusion region 28 may be narrower as compared to the conventional cases and therefore, the cell pitches can be made finer as compared to conventional cell pitches. Reference numeral X2 denotes a distance between the trench 3 and the contact hole 10a.

Even when mask displacement occurs during formation of the contact holes 18a, 19a of the horizontal p-channel MOSFET 22, the p+-type diffusion regions 24, 25 are formed in a self-aligning manner immediately under the contact holes 18a, 19a (a portion indicted by reference numeral 52). Therefore, even in a case of the structure for which contact resistivity is reduced by partially achieving a high impurity concentration in the p+-type source region 12 and the p+-type drain region 13 by the p+-type diffusion regions 24, 25, it is not necessary to give consideration to the margin for the mask displacement. Thus, the widths of the p+-type source region 12 and the p+-type drain region 13 (lateral widths; hereinafter, simply referred to as the widths) can be maintained at the same level as the conventional cases.

To achieve size reductions of the horizontal p-channel MOSFET 22, for example, one of the following four conditions is preferably applied to form the p+-type source region 12, the p+-type drain region 13, and the p+-type diffusion regions 24, 25. A first condition is that the p+-type source region 12 and the p+-type drain region 13 are formed to be shallow. By reducing the thickness of the p+-type source region 12 and the p+-type drain region 13, the lateral diffusion of the p+-type source region 12 and the p+-type drain region 13 can be accordingly suppressed. Therefore, a gate length (a lateral length of the gate electrode 17) can be made shorter.

A second condition is that the ion implantation 49 is performed through the contact holes 18a, 19a as described above to form the p+-type diffusion regions 24 and 25 inside the p+-type source region 12 and the p+-type drain region 13, respectively. Since the p+-type diffusion regions 24, 25 can be formed in a self-aligning manner immediately under the contact holes 18a, 19a, it is not necessary to give consideration to a margin for mask displacement.

A third condition is that the ion implantation 49 for forming the p+-type diffusion regions 24, 25 is performed at an acceleration voltage that is higher than that of the ion implantation 46 for forming the p+-type source region 12 and the p+-type drain region 13. For example, the ion implantation 49 for forming the p+-type diffusion regions 24, 25 is performed at such a high acceleration voltage as to penetrate oxide film residue (residue of an end portion of the local insulating film) (e.g., from about 100 keV to about 200 keV). This provides the following effect. FIG. 22 is an enlarged cross-sectional view of a state when a contact hole is formed on the p+-type source region side of the horizontal p-channel MOSFET depicted in FIG. 6. FIG. 22 depicts the state in which occurrence of mask displacement results in a LOCOS bird's beak (local insulating film end portion) 20a being removed by the etching for forming the contact holes 18a, 19a.

The oxide film residue is a protrusion (burr) portion remaining at an end portion of the LOCOS film 20 after etching when the LOCOS bird's beak 20a is removed by the etching. The LOCOS bird's beak 20a is a portion of the LOCOS film 20. The LOCOS bird's beak 20a is formed when the silicon nitride film is used as the mask as described above and is a portion that has grown to enter the underside of the mask (the side of the n−-type semiconductor layer 2), and is an end portion having a shape like a bird's beak where the thickness decreases toward the outside. For comparison, FIGS. 23 and 24 depict a state when the contact holes 116a, 117a of the horizontal p-channel MOSFET 122 are formed in the conventional semiconductor device (FIG. 25). FIGS. 23 and 24 are enlarged cross-sectional views of a state when the contact holes are formed on the p+-type source region side of the horizontal p-channel MOSFET depicted in FIG. 25.

As depicted in FIG. 23, the conventional semiconductor device has to have a margin X5 for a LOCOS bird's beak 120a set so as not to position the open portion 135a of the resist mask 135 above the LOCOS bird's beak 120a when the position of the resist mask 135 for forming the contact hole 116a is displaced.

If the margin X5 for the LOCOS bird's beak 120a is not set, when mask displacement occurs as depicted in FIG. 24, the LOCOS bird's beak 120a is removed along with the interlayer dielectric 109 by the etching for forming the contact hole 116a and the n−-type semiconductor layer 102 is exposed in the contact hole 116a. Therefore, the source electrode 116 formed inside the contact hole 116a short-circuits with the n−-type semiconductor layer 102 exposed inside the contact hole 116a. The same problem occurs on the side of the p+-type drain region 113 not depicted.

In contrast, in the second embodiment, even when the open portions 50a, 50c of the resist mask 50 for forming the contact holes 18a, 19a of the horizontal p-channel MOSFET 22 are positioned above the LOCOS bird's beak 20a, the source electrode 18 does not short-circuit with the n−-type semiconductor layer 2 for the following reason. For example, it is assumed that, as depicted in FIG. 22, the occurrence of mask displacement at the time of formation of the contact holes 18a, 19a of the horizontal p-channel MOSFET 22 results in the removal of the LOCOS bird's beak 20a along with the interlayer dielectric 109 by the etching. In this case, for example, even when the n−-type semiconductor layer 2 is exposed in the contact hole 18a on the p+-type source region 12 side, since the ion implantation 49 is subsequently performed through the contact hole 18a, the p+-type diffusion region 24 is formed in a self-aligning manner in the portion of the n−-type semiconductor layer 2 exposed in the contact hole 18a. For example, the ion implantation 49 is performed at such a high acceleration voltage as to penetrate an oxide film residue 20b whereby the p+-type diffusion region 24 is formed to extend from the p+-type source region 12 to immediately below the oxide film residue 20b (a portion of the n−-type semiconductor layer 2 contacting the oxide film residue 20b). Therefore, when the source electrode 18 (metal wiring layer) is formed, the n−-type semiconductor layer 2 is not exposed in the contact hole 18a. Since the source electrode 18 does not short-circuit with the n−-type semiconductor layer 2 even when the mask displacement occurs, it is not necessary to set the margin X5 for the LOCOS bird's beak 120a. Although not depicted, the p+-type diffusion region 25 may be formed on the p+-type drain region 13 side in the same way as the p+-type source region 12 side.

Since the contact between the metal wiring layer and the n−-type semiconductor layer 2 can be avoided regardless of the formation positions of the contact holes 18a, 19a as described above, for example, the contact holes 18a, 19a may be disposed closer to the LOCOS film 20 relative to the center (lateral center) of the Psd (the p+-type source region 12 and the p+-type drain region 13). Therefore, the width of the Psd from the gate electrode side end portion to the contact hole may be made wider than the width thereof from the LOCOS film side end portion to the contact hole. This is because, since the distance can be made longer between the gate insulating film 16 and the p$^+$-type diffusion regions 24 and 25, adverse effects due to hot carrier (variation in characteristics of threshold voltage and temporal destruction of the gate insulating film 16) can be suppressed.

A fourth condition is that the heat treatment after the formation of the p$^+$-type diffusion regions 24, 25 is performed at a lowest possible temperature for a short time. As a result, the diffusion of the p$^+$-type source region 12 and the p$^+$-type drain region 13 can be suppressed to restrain the widths of the p$^+$-type source region 12 and the p$^+$-type drain region 13 from widening. For example, the heat treatment for diffusing the p$^+$-type diffusion regions 24, 25 is performed by rapid thermal anneal (RTA) for a short time.

As described above, the second embodiment can achieve the same effects as the first embodiment. According to the second embodiment, since the p$^+$-type diffusion region can be formed in a self-aligning manner immediately under the contact hole by performing ion implantation through the contract hole, it is not necessary to set a margin for mask displacement of the resist mask for forming the contact hole and the p$^+$-type diffusion region. Therefore, both the vertical n-channel power MOSFET acting as the output stage device and the horizontal p-channel MOSFET making up the circuit unit can be reduced in size by the margin for the mask displacement. According to the second embodiment, since the p$^+$-type diffusion region is formed in a self-aligning manner immediately under the contact hole by performing the ion implantation through the contract hole, the n$^-$-type semiconductor layer that becomes the base region is not exposed inside the contact hole even when the LOCOS bird's beak is removed at the time of formation of the contact hole. This eliminates the need for setting the margin for the LOCOS bird's beak and therefore, enables further size reduction.

For example, the second embodiment enables mask dimensions to be reduced to the following values as compared to the conventional cases. In the conventional semiconductor devices, the width of the contact holes is set to 2.0 μm and the distances are set to 1.5 μm and 2.0 μm between the gate electrode and the contact holes and between the contact holes and the LOCOS film, respectively. On the other hand, in the second embodiment, the width of the contact holes can be set to 0.7 μm and the distances can be set to 1.0 μm both between the gate electrode and the contact holes and between the contact holes and the LOCOS film. As described above, as is the case with the first embodiment, the second embodiment enables a reduction in the width of the contact holes of the horizontal p-channel MOSFET making up the circuit unit as compared to the conventional cases. In the second embodiment, the distance between the contact holes and the LOCS film can be made shorter as compared to the conventional cases because no margin is set for the LOCOS bird's beak.

Although the semiconductor device taken as an example has the vertical n-channel power MOSFET of a trench gate structure for the output stage and the horizontal CMOS for the control circuit formed on the same semiconductor substrate in the above description, the present invention is applicable not only to the embodiments described above but also to circuits having various configurations. For example, the vertical n-channel power MOSFET for the output stage may have a planar gate structure, and multiple semiconductor devices may further be disposed on the same semiconductor substrate in addition to the vertical n-channel power MOSFET for the output stage and the horizontal CMOS for the control circuit. Although a first conductive type is the n-type and a second conductive type is the p-type in the embodiments, the present invention can be achieved with the first conductive type and the second conductive type defined as the p-type and the n-type, respectively.

The semiconductor device and the method of manufacturing a semiconductor device according to the present invention produce an effect of improved contact properties between the metal wiring layer and the semiconductor portion even when the contact hole for connecting the metal wiring layer and the semiconductor portion (the third and fourth semiconductor regions) is reduced in width so as to achieve reductions in size consequent to enabling the third and fourth semiconductor regions to partially have high impurity concentrations by the second and third diffusion regions, respectively.

As described above, the semiconductor device and the method of manufacturing a semiconductor device according to the present invention are useful for power semiconductor devices used as industrial and automotive intelligent power switches (IPSs) etc., and are particularly suitable for an integrated circuit (IC) having a vertical power semiconductor device for an output stage and a horizontal semiconductor device for a control circuit of the vertical power semiconductor device formed on a single semiconductor substrate.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of manufacturing a semiconductor device having a vertical semiconductor device and a horizontal semiconductor device disposed on a single semiconductor substrate,
   the vertical semiconductor device having
      a first semiconductor region of a second conductivity type, the first semiconductor region being selectively disposed in a surface layer of a side of the semiconductor substrate, the surface layer configuring a semiconductor layer of a first conductivity type,
      a second semiconductor region of the first conductivity type, the second semiconductor region being selectively disposed inside the first semiconductor region,
      a first gate insulating film contacting the first semiconductor region at a portion between the semiconductor layer and the second semiconductor region, and
      a first gate electrode contacting the first gate insulating film,
   the horizontal semiconductor device having
      a third semiconductor region of the second conductivity type, the third semiconductor region being selectively disposed in the surface layer and away from the first semiconductor region,
      a fourth semiconductor region of the second conductivity type, the fourth semiconductor region being selectively disposed in the surface layer and away from the first semiconductor region and the third semiconductor region,
      a second gate insulating film, and
      a second gate electrode disposed on a surface of the semiconductor layer, in a portion interposed between the third semiconductor region and the fourth semiconductor region, the second gate electrode being disposed on and contacting the second gate insulating film, the method comprising:

forming the first gate insulating film and the second gate insulating film on said side of the semiconductor substrate;

forming
the first gate electrode so as to contact the first gate insulating film, and
the second gate electrode so as to contact the second gate insulating film;

after the forming the first gate electrode and the second gate electrode, selectively forming the first semiconductor region in the surface layer so as to contact the first gate insulating film;

after the forming the first gate electrode and the second gate electrode, forming the third semiconductor region and the fourth semiconductor region in a self-aligning manner at the second gate electrode by ion implantation using the second gate electrode as a mask;

after the forming the third semiconductor region and the fourth semiconductor region, selectively forming the second semiconductor region inside the first semiconductor region;

after the forming the second semiconductor region, forming an interlayer dielectric on a principal surface of the semiconductor substrate;

selectively removing portions of the interlayer dielectric so as to form a plurality of contact holes respectively exposing different corresponding ones of the first semiconductor region, the third semiconductor region, and the fourth semiconductor region;

respectively forming inside the first semiconductor region, the third semiconductor region, and the fourth semiconductor region by ion implantation through the plurality of contact holes, a first diffusion region that is of the second conductivity type and has an impurity concentration higher than that of the first semiconductor region, a second diffusion region that is of the second conductivity type and has an impurity concentration at least equal to that of the third semiconductor region, and a third diffusion region that is of the second conductivity type and has an impurity concentration at least equal to that of the fourth semiconductor region; and forming through the plurality of contact holes and after the forming the first diffusion region, the second diffusion region, and the third diffusion region, a plurality of metal wiring layers that are respectively connected to the first diffusion region, the second diffusion region, and the third diffusion region.

2. The method according to claim 1, wherein
in the forming the plurality of contact holes, a contact hole from among the contact holes for connecting the second diffusion region is disposed so that a metal wiring layer among the plurality of metal wiring layers is formed toward an end portion of the third semiconductor region, the third semiconductor region has a first side that is toward the second gate electrode and a second side opposite to the first side, the end portion being on the second side of the third semiconductor region.

3. The method according to claim 1, wherein
in the forming the plurality of contact holes, a contact hole from among the contact holes for connecting the third diffusion region is disposed so that a metal wiring layer from among the plurality of metal wiring layers is formed toward an end portion of the fourth semiconductor region, the fourth semiconductor region has a first side that is toward the second gate electrode and a second side opposite the first side, the end portion being on the second side of the fourth semiconductor region.

4. The method according to claim 1, further comprising forming on the side of the semiconductor substrate before forming the first gate insulating film and the second gate insulating film, a local insulating film that separates the vertical semiconductor device and the horizontal semiconductor device, wherein
the second diffusion region extends from the third semiconductor region to a portion of the substrate covered by residue of an end portion of the local insulating film from which a part has been removed consequent to exposure in one of the contact holes when exposing the third semiconductor region.

5. The method according to claim 1, further comprising forming on the side of the semiconductor substrate before forming the first gate insulating film and the second gate insulating film, a local insulating film that separates the vertical semiconductor device and the horizontal semiconductor device, wherein
the third diffusion region extends from the fourth semiconductor region to a portion of the substrate covered by residue of an end portion of the local insulating film from which a part has been removed consequent to exposure in one of the contact holes when exposing the third semiconductor region.

* * * * *